(12) United States Patent
Kim et al.

(10) Patent No.: US 11,049,584 B2
(45) Date of Patent: Jun. 29, 2021

(54) INTEGRATED CIRCUIT MEMORY DEVICES HAVING BUFFER DIES AND TEST INTERFACE CIRCUITS THEREIN THAT SUPPORT TESTING AND METHODS OF TESTING SAME

(71) Applicant: Samsung Electronics Co., Ltd., Suwon-si (KR)

(72) Inventors: Ki-Heung Kim, Suwon-si (KR); Kyo-Min Sohn, Yongin-si (KR); Young-Soo Sohn, Seoul (KR)

(73) Assignee: Samsung Electronics Co., Ltd.

( * ) Notice: Subject to any disclaimer, the term of this patent is extended or adjusted under 35 U.S.C. 154(b) by 72 days.

(21) Appl. No.: 16/574,808

(22) Filed: Sep. 18, 2019

(65) Prior Publication Data
US 2020/0227130 A1 Jul. 16, 2020

(30) Foreign Application Priority Data

Jan. 15, 2019 (KR) .......................... 10-2019-0005127
Mar. 15, 2019 (KR) .......................... 10-2019-0029642

(51) Int. Cl.
*G11C 29/38* (2006.01)
*H01L 25/065* (2006.01)
(Continued)

(52) U.S. Cl.
CPC .............. *G11C 29/38* (2013.01); *G11C 7/222* (2013.01); *G11C 11/4076* (2013.01);
(Continued)

(58) Field of Classification Search
CPC . G11C 29/38; G11C 29/025; G11C 29/50012; G11C 11/4093;
(Continued)

(56) References Cited

U.S. PATENT DOCUMENTS 7,138,877 B2    11/2006   Vu et al.
7,502,267 B2     3/2009   Lin et al.
(Continued)

OTHER PUBLICATIONS

D. U. Lee et al., "A 1.2 V 8 Gb 8-Channel 128 GB/s High-Bandwidth Memory (HBM) Stacked DRAM With Effective I/O Test Circuits," in IEEE Journal of Solid-State Circuits, vol. 50, No. 1, pp. 191-203, Jan. 2015. (Year: 2015).*
(Continued)

*Primary Examiner* — Cynthia Britt
(74) *Attorney, Agent, or Firm* — Myers Bigel, P.A.

(57) ABSTRACT

An integrated circuit device includes a stack of integrated circuit memory dies having a plurality of through-substrate vias (TSVs) extending therethrough, and a buffer die electrically coupled to the plurality of TSVs. The buffer die includes a test interface circuit, which is configured to: (i) generate a plurality of internal test signals, which are synchronized with a second clock signal having a second frequency, from at least one control code, and from a plurality of external test signals, which are synchronized with a first clock signal having a first frequency less than the second frequency, and (ii) provide the plurality of internal test signals to at least one of the memory dies in said stack during a first test mode. The second frequency may be greater than three (3) times the first frequency.

20 Claims, 20 Drawing Sheets

(51) Int. Cl.
*G11C 29/12* (2006.01)
*G11C 11/4076* (2006.01)
*G11C 7/22* (2006.01)
*G11C 11/4093* (2006.01)
*G11C 29/56* (2006.01)
*G11C 29/02* (2006.01)
*G11C 29/50* (2006.01)

(52) U.S. Cl.
CPC ........ *G11C 11/4093* (2013.01); *G11C 29/025* (2013.01); *G11C 29/12015* (2013.01); *G11C 29/50012* (2013.01); *G11C 29/56012* (2013.01); *H01L 25/0657* (2013.01); *H01L 2225/06541* (2013.01)

(58) Field of Classification Search
CPC .............. G11C 29/56012; G11C 7/222; G11C 29/12015; G11C 11/4076; G11C 7/1093; G11C 2207/107; G11C 7/1066; G11C 5/025; H01L 25/0657; H01L 2225/06541; H01L 2224/16145; H01L 25/0652; H01L 25/18; H01L 2225/06596; H01L 2924/15311; H01L 2225/06513
See application file for complete search history.

(56) References Cited

U.S. PATENT DOCUMENTS

| | | | |
|---|---|---|---|
| 7,551,499 | B2 | 6/2009 | Lee |
| 7,802,154 | B2 | 9/2010 | Park |
| 8,300,496 | B2 | 10/2012 | Yun et al. |
| 8,473,795 | B2 | 6/2013 | Whetsel |
| 2001/0028599 | A1 | 10/2001 | Aikawa |
| 2003/0182595 | A1 | 9/2003 | Carnevale et al. |
| 2004/0179421 | A1* | 9/2004 | Kim ........................ G11C 7/225 365/233.1 |
| 2008/0080261 | A1* | 4/2008 | Shaeffer ................. G11C 7/222 365/189.05 |
| 2018/0082726 | A1* | 3/2018 | Kang .................... G06F 3/0629 |
| 2020/0202910 | A1* | 6/2020 | Park ..................... G11C 7/1093 |

OTHER PUBLICATIONS

K. Sohn et al., "A 1.2 V 20 nm 307 GB/s HBM DRAM With At-Speed Wafer-Level IO Test Scheme and Adaptive Refresh Considering Temperature Distribution," in IEEE Journal of Solid-State Circuits, vol. 52, No. 1, pp. 250-260, Jan. 2017. (Year: 2017).*

* cited by examiner

410

INTEGRATED CIRCUIT MEMORY DEVICES HAVING BUFFER DIES AND TEST INTERFACE CIRCUITS THEREIN THAT SUPPORT TESTING AND METHODS OF TESTING SAME

REFERENCE TO PRIORITY APPLICATIONS

This application claims the benefit of priority under 35 USC § 119 to Korean Patent Application No. 10-2019-0005127, filed Jan. 15, 2019, and to Korean Patent Application No. 10-2019-0029642, filed Mar. 15, 2019, in the Korean Intellectual Property Office, the entire disclosures of which are hereby incorporated herein by reference.

BACKGROUND

The present disclosure relates to memory devices and, more particularly, to semiconductor memory devices and methods of efficiently testing semiconductor memory devices.

Low-frequency tests may be performed on semiconductor memory devices on a wafer, whereas high-frequency tests may be performed after the semiconductor memory devices are packaged, when the semiconductor memory devices are high bandwidth memory (HBM) devices, for example. Unfortunately, high cost test devices are typically needed to support high-frequency testing of semiconductor memory devices on a wafer.

SUMMARY

Example embodiments may provide semiconductor memory devices having a configuration that enables high-frequency testing at a relatively low cost. Other example embodiments may provide methods of testing semiconductor memory devices, which enables high-frequency testing at relatively low cost. Additional example embodiments of the invention may provide semiconductor memory devices that are capable of supporting full command sets with partial command sets.

According to some example embodiments, a semiconductor memory device includes a buffer die, a plurality of memory dies stacked on the buffer die and a plurality of through silicon vias (TSVs). The buffer die communicates with an external device. The TSVs extend through the plurality of memory dies to connect to the buffer die. The buffer die includes a test interface circuit (TIC). This test interface circuit is configured to perform tests on the memory dies by converting test signals received through a first pad unit (from the external device) into internal test signals based on at least one control code received through a second pad unit, and by providing the internal test signals to at least one of the memory dies in a first test mode. The test signals are synchronized with a first clock signal toggling with a first frequency and the internal test signals are synchronized with a second clock signal toggling with a second frequency. The second frequency is greater than the first frequency.

According to some example embodiments, there is provided a method of testing a semiconductor memory device which includes a buffer dies and a plurality of memory dies stacked on the buffer die. In the method, test signals from an external automated test equipment/device (ATE) are received by the buffer die. The test signals are converted by a test interface circuit in the buffer die into internal test signals based on a received control code. And, the internal test signals are provided, by the test interface circuit, to at least one of the memory dies through a plurality of through silicon vias (TSVs) extending through the plurality of memory dies to connect to the buffer die. The test signals are synchronized with a first clock signal toggling with a first frequency and the internal test signals are synchronized with a second clock signal toggling with a second frequency.

According to example embodiments, a semiconductor memory device includes a memory cell array, an interface circuit and a control logic circuit. The memory cell array includes a plurality of dynamic memory cells coupled to a plurality of word-lines and a plurality of bit-lines. The interface circuit generates an internal command based on a command and a control code received from an external device. The control logic circuit controls access on the memory cell array based on the internal command and an address from the external device. A number of second command sets designated by the internal command is greater than a number of first command sets designated by the command.

Accordingly, the semiconductor memory device may perform P times higher-frequency testing on the buffer die and the memory dies with a relatively low-cost ATE by adding pads smaller than P, converting the test signals with a first frequency to internal test signals with a second frequency based on control codes inputted to the added pads and a serializer, and providing the internal test signals to the memory dies. In addition, the semiconductor memory device may support full command sets with partial command sets by using the added pads.

According to still further embodiments of the invention, an integrated circuit device includes a stack of memory dies having a plurality of through-substrate vias (TSVs) extending therethrough, and a buffer die electrically coupled to the plurality of TSVs. The buffer die includes a test interface circuit (TIC). This TIC is configured to: (i) generate a plurality of internal test signals, which are synchronized with a second clock signal having a second frequency, from at least one control code, and from a plurality of external test signals, which are synchronized with a first clock signal having a first frequency less than the second frequency, and (ii) provide the plurality of internal test signals to at least one of the memory dies in said stack during a first test mode. The second frequency may be greater than three (3) times the first frequency. In some embodiments of the invention, the TIC includes a phase-locked loop (PLL) configured to generate the second clock signal in response to a reference clock signal. This PLL may be configured to generate a plurality of internal clock signals including the second clock signal.

In some embodiments of the invention, the TIC includes a serializer, which is configured to use the plurality of internal clock signals when generating the internal test signals by sequentially merging parallel data corresponding to the external test signals. This serializer may include a first serializer stage, which is configured to generate first intermediate parallel data by merging the parallel data in-sync with a first of the plurality of internal clock signals, and a second serializer stage, which is configured to generate second intermediate parallel data by merging the first intermediate parallel data in-sync with a second of the plurality of internal clock signals having a different frequency relative to the first of the plurality of internal clock signals. This serializer may also include: (i) a third serializer stage configured to generate internal serial data by merging the second intermediate parallel data in-sync with a third of the plurality of internal clock signals having a different frequency relative to the second of the plurality of internal clock signals, and (ii) a fourth delay stage configured to generate final serial data by delaying the internal serial data.

In some of these embodiments of the invention, a frequency of the second of the plurality of internal clock signals is two times greater than a frequency of the first of the plurality of internal clock signals, and a frequency of the third of the plurality of internal clock signals is two times greater than the frequency of the second of the plurality of internal clock signals. In other embodiments of the invention, the test interface circuit may include data selection logic, which is configured to generate the parallel data by combining the plurality of external test signals and an input signal, based on the at least one control code. The external test signals and the input signal can include row addresses.

BRIEF DESCRIPTION OF THE DRAWINGS

Example embodiments will be described hereinbelow in more detail with reference to the accompanying drawings.

DETAILED DESCRIPTION

Various example embodiments will be described more fully hereinafter with reference to the accompanying drawings, in which example embodiments of the invention are shown.

Figure 1:
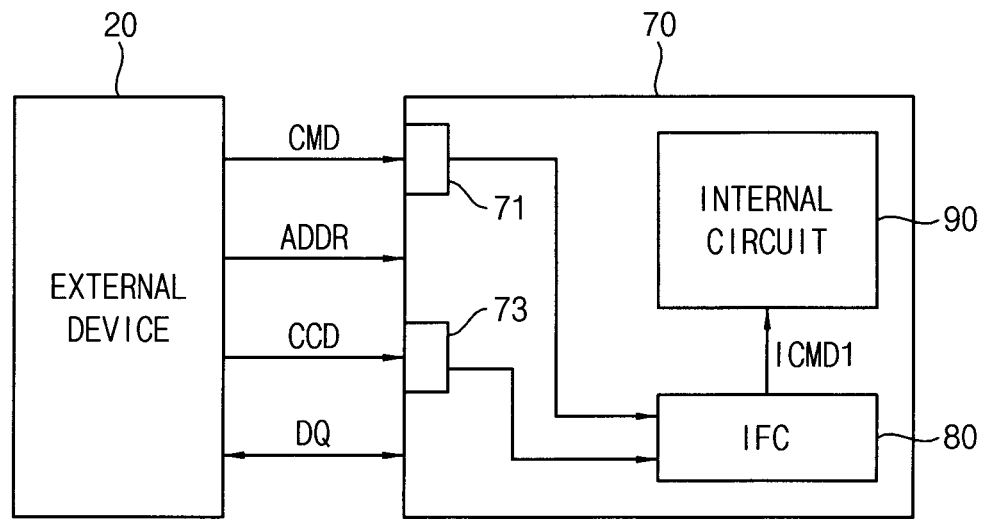
FIG. 1 is a block diagram illustrating a data processing system according to example embodiments.

FIG. 1 is a block diagram illustrating a data processing system according to example embodiments. Referring to FIG. 1, a data processing system 10 may include an external device 20 and a semiconductor memory device 70. This external device 20 transmits, among other things, a command CMD, an address ADDR and a control code CCD to the semiconductor memory device 70 and exchanges data DQ with the semiconductor memory device 70. In an example embodiment, the external device 20 may include an automated test device/equipment (ATE) or a memory controller. The semiconductor memory device 70 may include an internal circuit 90 and an interface circuit 80. The internal circuit 90 may include a memory cell array to store data and a control logic circuit to control access on the memory cell array.

The interface circuit 80 is connected to a first pad unit 71 and a second pad unit 73. The interface circuit 80 may receive: (i) the command CMD through the first pad unit 71, (ii) the control code CCD through the second pad unit 73, and may generate an internal command ICMD1 by combining the command CMD and the control code CCD, and may then provide the internal command ICMD1 to the internal circuit 90. The first pad unit 71 may include a plurality of first pads and the second pad unit 73 may include a plurality of second pads. In some embodiments, the command CMD may designate a first number of command sets, the internal command ICMD1 may designate a second number of command sets and the second number may be greater than the first number. Accordingly, the data processing system 10 or the semiconductor memory device 70 may support full command sets with partial command sets.

Figure 2:
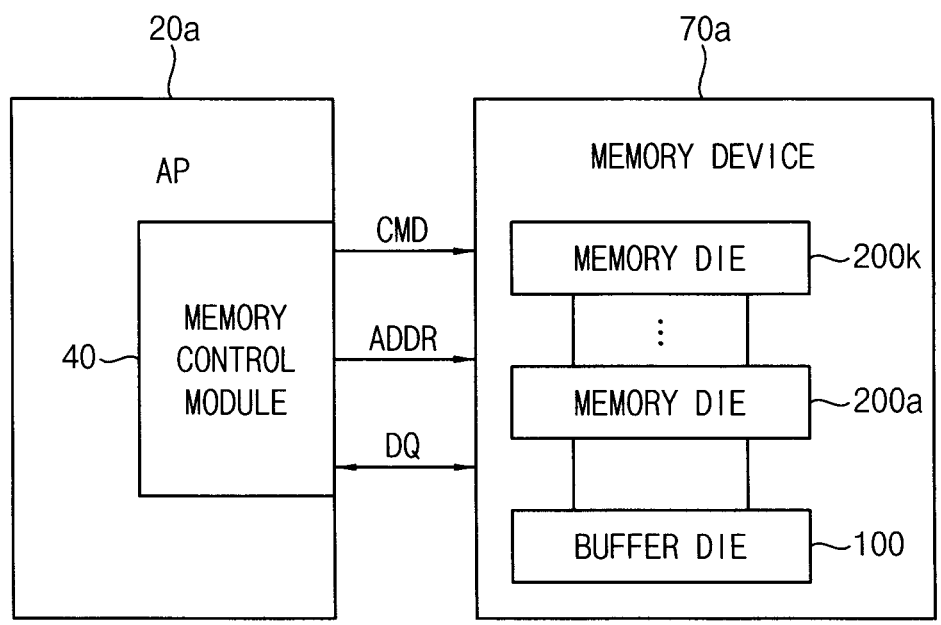
FIG. 2 is a block diagram illustrating an example of a data processing system according to example embodiments.

FIG. 2 is a block diagram illustrating an example of a data processing system according to example embodiments. Referring to FIG. 2, a data processing system 10a may include an application processor 20a and a semiconductor memory device 70a in some embodiments. The application processor 20 may include a memory control module 40 and the memory control module 40 and the semiconductor memory device 70a may constitute a memory system. In some embodiments, the application processor 20a may perform a function of the host. Furthermore, the application processor 20a may be implemented as a system-on-a-chip (SoC). The SoC may include a system bus (not illustrated) to which a protocol having a predetermined standard bus specification is applied, and may include various types of intellectual property (IP) cores connected to the system bus.

As a standard specification of the system bus, an advanced microcontroller bus architecture (AMBA) protocol of Advanced RISC Machines (ARM) Holdings may be applied. An advanced high-performance bus (AHB), an advanced peripheral bus (APB), an advanced eXtensible interface (AXI), AXI4, AXI coherency extensions (ACE), and the like may be included as a type of the bus of the AMBA protocol. In addition, other type of protocols such as uNetwork of Sonics Inc., CoreConnect of IBM Corp., Open Core Protocol of Open Core Protocol International Partnership Association, Inc. (OCP-IP), and the like may be applied.

The semiconductor memory device 70a may include a buffer die 100 and a plurality of memory dies 200a~200k, where k is an integer greater than two. The buffer die 100 and the memory dies 200a~200k may be sequentially stacked on each other. The memory dies 200a~200k stacked on the buffer die 100 may be electrically connected to the buffer die 100 through conducting means. The conducting means may be one or more through silicon via (TSV)s.

The buffer die 100 may communicate with the memory control module 40 and each of the memory dies 200a~200k may be a memory device including dynamic memory cells such as a double data rate synchronous DRAM (DDR SDRAM), a low power DDR (LPDDR) SDRAM, a graphics DDR (GDDR) SDRAM, a Rambus DRAM (RDRAM), or a similar type device.

Figure 3:
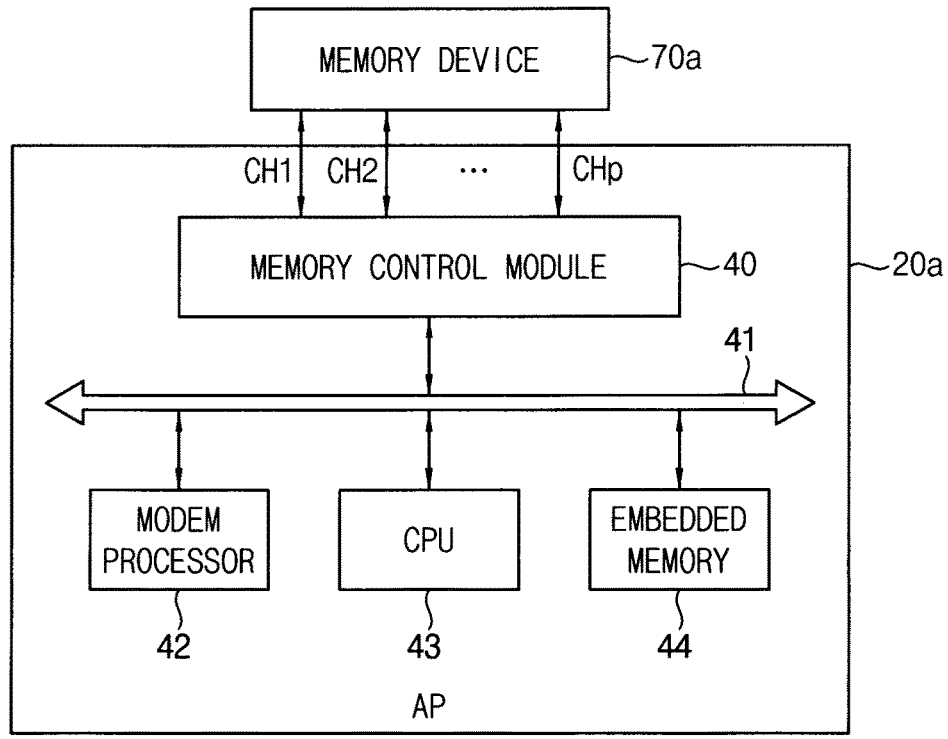
FIG. 3 is a block diagram illustrating an example of the application processor in FIG. 2 according to example embodiments.

FIG. 3 is a block diagram illustrating an example of the application processor in FIG. 2 according to example embodiments. Referring to FIGS. 2 and 3, the application processor 20a may include a plurality of IP cores connected through a system bus 41. The application processor 20 may include, among other things, the memory control module 40, a modem processor 42, a central processing unit (CPU) 43, and an embedded memory 44, as shown. The CPU 43 may control various types of operations of the IP cores inside application processor 20a, and the modem processor 42 is a processor for performing wireless communication with a base station or other communication devices.

The memory control module 40 may communicate with the semiconductor memory device 70a disposed outside the application processor 20b through a plurality of independent channels corresponding to a plurality of memory cell groups CH1 to CHp, wherein p is a natural number greater than two. Furthermore, the memory control module 40 may communicate with embedded memory 44 through the system bus 41.

Figure 4:
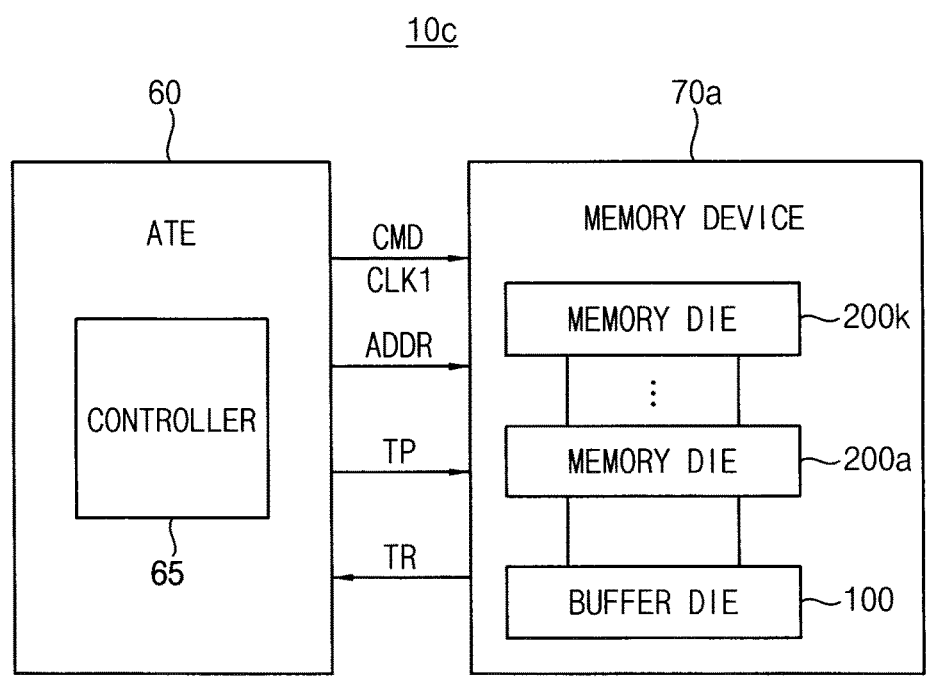
FIG. 4 is a block diagram illustrating another example of a memory system according to example embodiments.

FIG. 4 is a block diagram illustrating another example of a memory system according to example embodiments. Referring to FIG. 4, a memory system (or a test system) 10c may include an ATE 60 and a semiconductor memory device 70a. The semiconductor memory device 70a may be in a chip-on wafer state in which buffer die 100 is formed on a wafer and the memory dies 200a~200k are stacked on the buffer die 100 before the semiconductor memory device 70a is packaged.

Advantageously, the ATE 60 may perform a test on the buffer die 100 and the memory dies 200a~200k in the semiconductor memory device 70a. For testing the buffer die 100 and the memory dies 200a~200k, the ATE 60 may provide test signals synchronized with a first clock signal CLK1 toggling with a first frequency and may receive test result data TR responding to a test pattern data TP from the semiconductor memory device 70a. The test signals may include the command CMD, the address ADDR and the test pattern data TP.

The ATE 60 may include a controller 65 that controls a test sequence on the semiconductor memory device 70a. The buffer die 100 may perform test on the memory dies 200a~200k by receiving the first clock signal CLK1 and the test signals, by converting the test signals into internal test signals synchronized with a second clock signal toggling with a second frequency and by providing the internal test signals to at least one of the memory dies 200a~200k. The second frequency may be greater than the first clock signal.

Figure 5:
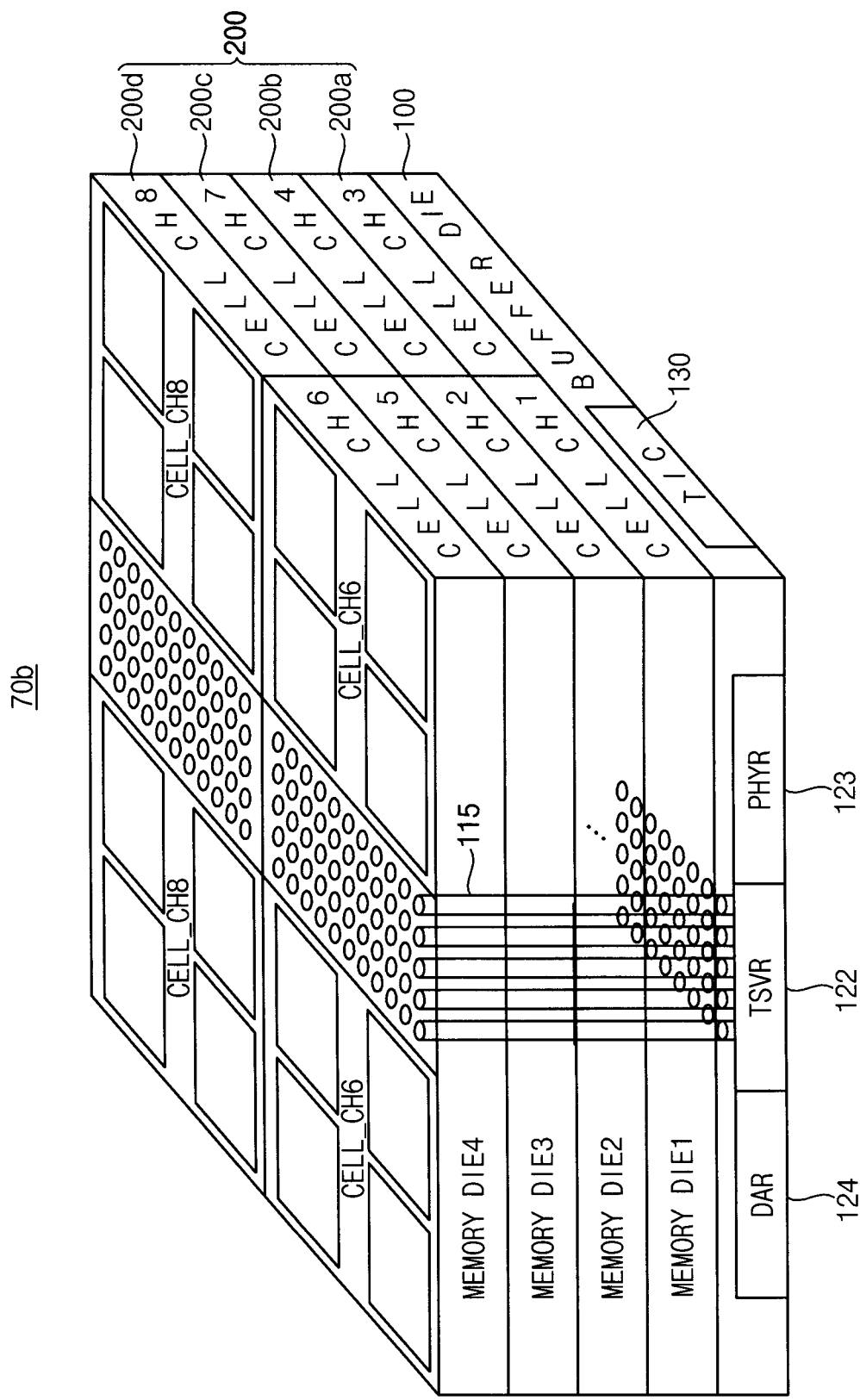
FIG. 5 is a block diagram illustrating an example of the semiconductor memory device in FIGS. 2 and 4 according to example embodiments.

FIG. 5 is a block diagram illustrating an example of the semiconductor memory device in FIGS. 2 and 4 according to example embodiments. In FIG. 5, a semiconductor memory device in a high bandwidth memory (HBM) form having an increased bandwidth by including a plurality of independent channels having independent interfaces is illustrated. Referring to FIG. 5, a semiconductor memory device 70b may include a plurality of layers. For example, the semiconductor memory device 70b may include a buffer die 100 and one or more memory dies 200 which are stacked on buffer die 100. In the example of FIG. 5, although first to fourth memory dies 200a to 200d are illustrated as being provided, the number of the memory dies may be variously changed according to other embodiments of the invention. Furthermore, each of the memory dies 200 may include one or more channels. A single memory die includes two channels in the example of FIG. 5, and thus an example in which the semiconductor memory device 70b has eight channels CH1 to CH8 is illustrated.

For example, a first memory die 200a may include a first channel CH1 and a third channel CH3, a second memory die 200b may include a second channel CH2 and a fourth channel CH4, a third memory die 200c may include a fifth channel CH5 and a seventh channel CH7, and a fourth memory die 200d may include a sixth channel CH6 and an eighth channel CH8.

The buffer die 100 may communicate with the ATE 60 in a test mode, may receive the test signals synchronized with a first clock signal CLK1 toggling with a first frequency, from the ATE 60, may convert the test signals into internal test signals synchronized with a second clock signal toggling with a second frequency and may provide the internal test signals to the memory dies 200. The buffer die 100 may communicate with the ATE 60 through conducting means such as bumps formed an outer surface of the semiconductor memory device 70b.

Furthermore, the semiconductor memory device 70b may include a plurality of TSVs 115 passing through the layers. These TSVs 115 may be disposed corresponding to the plurality of channels CH1 to CH8, and the TSVs 115 may include components for inputting and outputting 1024-bit data when each of the independent channels has a 128-bit bandwidth.

The TSVs 115 may be disposed to pass through the first to fourth memory dies 200a to 200d, and each of the first to fourth memory dies 200a to 200d may include a transmitter/a receiver connected to the TSVs 115. When a normal operation in which the inputting and outputting of the data is independently performed for each channel, only the transmitter/receiver of any one core die may be enabled, with respect to each of the TSVs 115, and thus each of the TSVs 115 may independently deliver only the data of any one memory die, or any channel, as an independent channel for that one memory die or channel. And, the buffer die 100 may include a test interface circuit TIC 130, a TSV region TSVR 122, a physical region PHYR 123 and a direct access region DAR 124. The test interface circuit 130 may be disposed in the direct access region 124.

The TSV region 122 is a region in which TSVs 115 for communicating with the memory dies 200 are formed. Further, the physical region 123 is a region including a plurality of input-and-output (IO) circuits for communicating with an external memory controller, and various types of signals from the memory controller may be provided to the TSV region 122 through the physical region 123 and to the memory dies 200 through the TSVs 115.

The direct access region 124 may directly communicate with the ATE 60 in a test mode for the stacked memory device 70a through a conductive means which is disposed on an outer surface of the semiconductor memory device 70b. Various types of signals provided from the ATE 60 may be provided to the memory dies 200 through the direct access region 124 and the TSV region 122. Alternatively, various types of signals provided from the ATE 60 may be provided to the memory dies 200 through the direct access region 124, the physical region 123, and the TSV region 122.

The test interface circuit 130 may perform a high-frequency test on the memory dies 200 by converting the test signals synchronized with a first clock signal toggling with a first frequency, from the ATE 60 into internal test signals synchronized with a second clock signal toggling with a second frequency and by providing the internal test signals to the memory dies 200.

Figure 6:
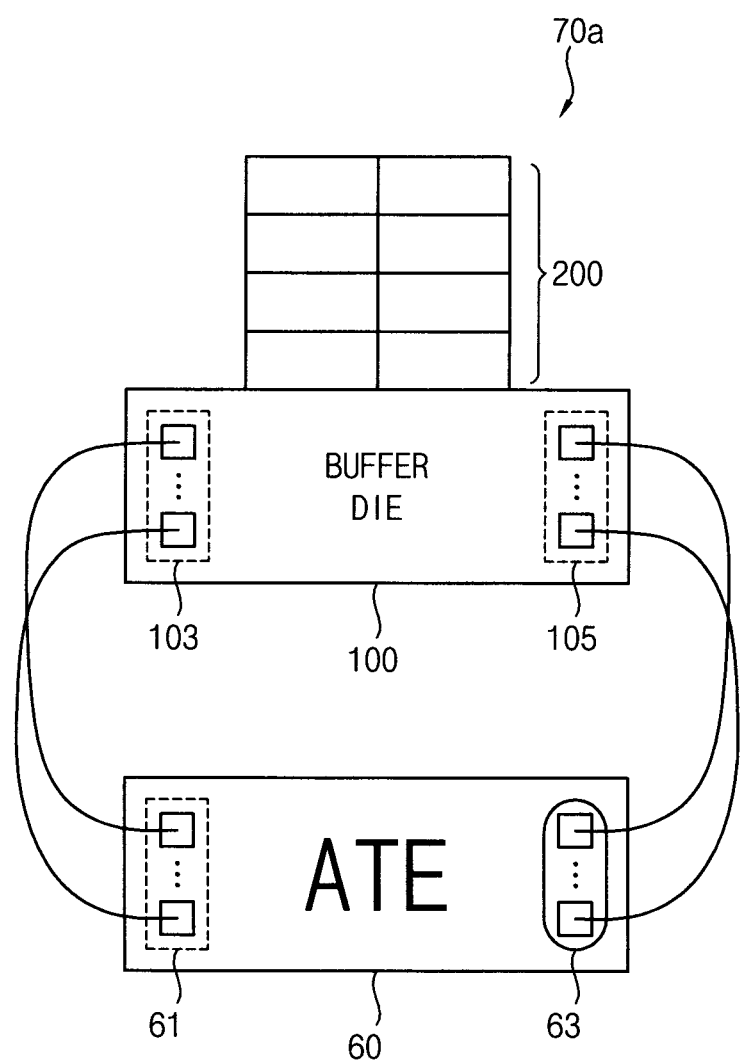
FIG. 6 illustrates connection relationship between the semiconductor memory device and the automatic test equipment (ATE) illustrated in FIG. 4.

FIG. 6 illustrates connection relationship between the semiconductor memory device and the ATE in FIG. 4. Referring to FIG. 6, the ATE 60 and the semiconductor memory device 70a may be connected to each other through first pad units 61 and 103 and second pad unit 63 and 105, and the first pad unit 103 and the second pad unit 105 may be connected to the buffer die 100. The first pad units 61 and 103 may be used for applying test signals to the semiconductor memory device 70b in a second test mode (e.g., low-frequency test mode) and the second pad unit 63 and 105 may be used for applying a control code, a command and an address to the semiconductor memory device 70b in a first test mode (e.g., high-frequency test mode). The first pad unit 103 may include a plurality of default pads and the second pad unit 105 may include a plurality of additional pads. The number of the plurality of additional pads in the second pad unit 105 may be smaller than the number needed in the high-frequency test.

Figure 7:
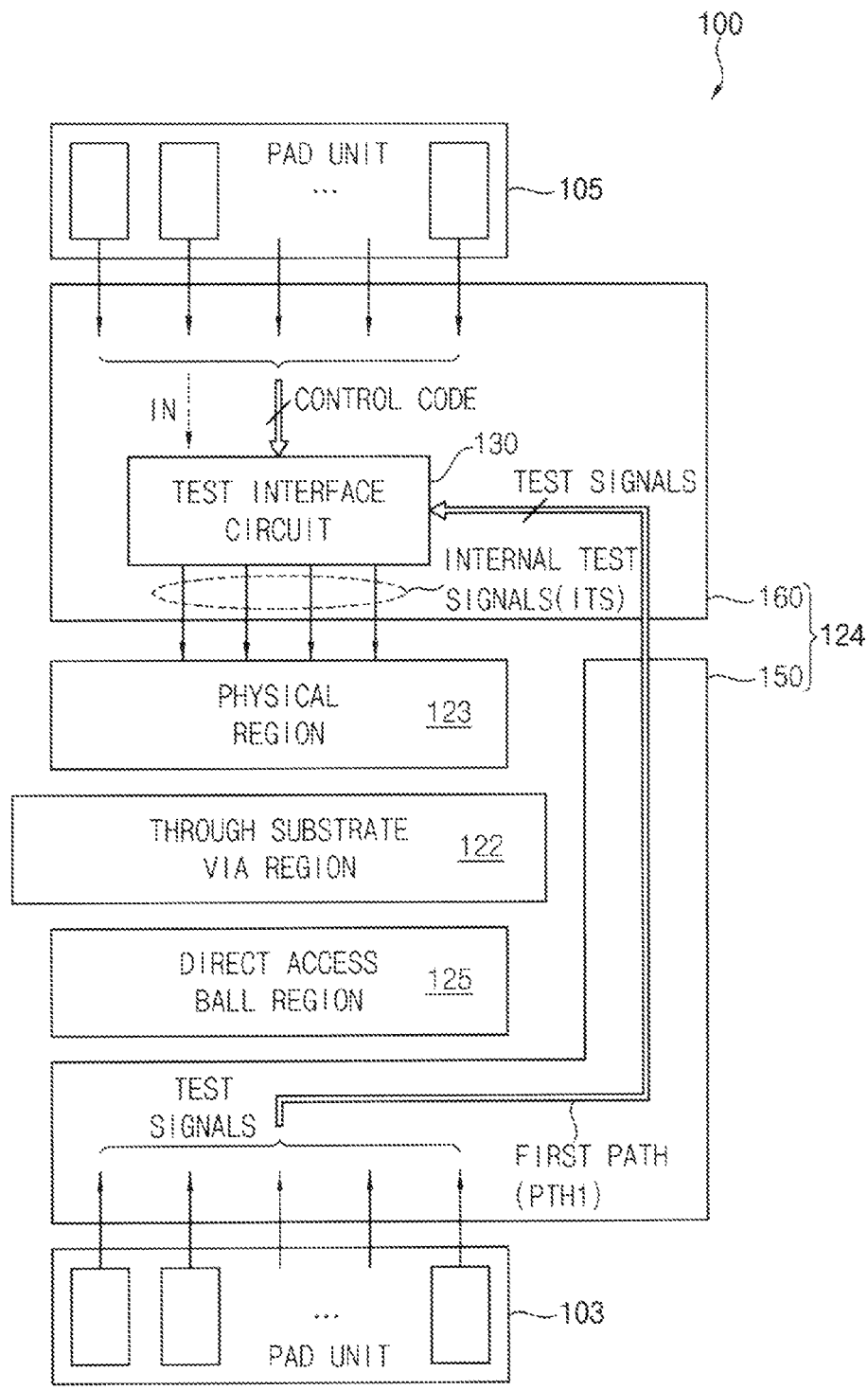
FIG. 7 illustrates an example of the buffer die in the semiconductor memory device of FIG. 4 or FIG. 5.

FIG. 7 illustrates an example of the buffer die in the semiconductor memory device of FIG. 4 or FIG. 5. Referring to FIG. 7, the buffer die 100 may include the TSV region 122, the physical region 123 and the direct access region 124 and the direct access region 124 may include a direct access (DA) ball region 125, a first sub region 150 and a second sub region 160.

DA balls may be formed in the DA ball region 125, the first sub region 150 may be connected to the first pad unit 103 and the second sub region 160 may be connected to the second pad unit 105. The first sub region and the second sub region 160 may be disposed adjacent to each other. A plurality of first pads (normal pads or default pads) may be disposed in the first pad unit 103 and a plurality of second pads (additional pads and control pads) may be disposed in the second pad unit 105. The first sub region 150 may include an aligner and a first-in first-out (FIFO) buffer and may transfer test signals TS from the ATE 60 to the second sub region 160 via a first path PTH1.

The test interface circuit 130 is disposed in the second sub region 160. The test interface circuit 130 may receive the input signal IN and at least one control code CCD which are received through the second pad unit 105 and may perform one of the low-frequency test and the high-frequency test on the memory dies 200 by using the test signals TS. When the test interface circuit 130 performs the high-frequency test, the test interface circuit 130 may convert the test signals TS synchronized with a first clock signal toggling with a first frequency into the internal test signals ITS synchronized with a second clock signal toggling with a second frequency and may provide the internal test signals ITS to the physical region 123.

Figure 8:
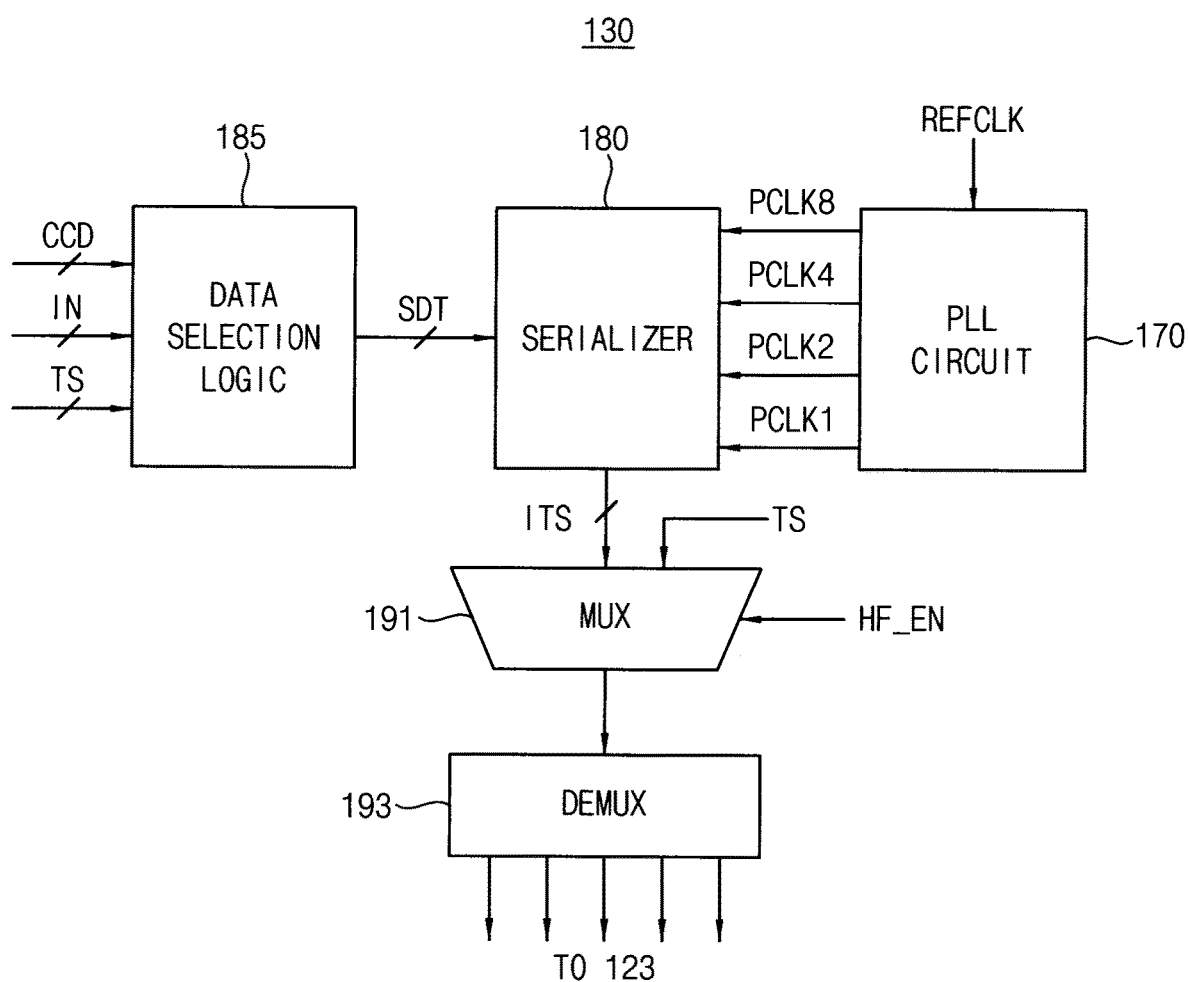
FIG. 8 is a block diagram illustrating the test interface circuit in FIG. 7 according to example embodiments.

FIG. 8 is a block diagram illustrating the test interface circuit in FIG. 7 according to example embodiments. Referring to FIG. 8, the test interface circuit 130 may include a phase-locked loop (PLL) circuit 170, a serializer 180, a data selection logic 185, a multiplexer 191 and an demultiplexer 193 and may perform one of the high-frequency test and the low-frequency test on the memory dies 200. The data selection logic 185 may generate the parallel data SDT by combining the test signals TS and the input signal IN received through the second pad unit 105 based on the at least one control code CCD received through the second pad unit 105.

The PLL circuit 170 may generate internal clock signals PCLK8, PCLK4, PCLK2 and PCLK1 based on a reference clock signal REFCLK received through the second pad unit 105 and may provide the internal clock signals PCLK8, PCLK4, PCLK2 and PCLK1. A frequency of a first internal clock signal PCLK8 may be the same as a frequency of the first clock signal CLK1, a frequency of a second internal clock signal PCLK4 may be two times greater than the frequency of the first clock signal CLK1, a frequency of a third internal clock signal PCLK2 may be four times greater than the frequency of the first clock signal CLK1, and a frequency of a fourth internal clock signal PCLK1 may be eight times greater than the frequency of the first clock signal CLK1.

In some embodiments of the invention, the serializer 180 may serialize the parallel data SDT into the internal test signals ITS which are serial data by using the internal clock signals PCLK8, PCLK4, PCLK2 and PCLK1 and may synchronize the internal test signals ITS with the fourth internal clock signal PCLK1. The fourth internal clock signal PCLK1 may be referred to as a second clock signal.

The multiplexer 191 may select one of the test signals TS and the internal test signals ITS in response to a test mode enable signal HF_EN to provide selected test signals to a demultiplexer 193. The test mode enable signal HF_EN may designate one of a first test mode corresponding to the high-frequency test and a second test mode corresponding to the low-frequency test. In addition, the demultiplexer 193 may perform demultiplexing on the selected test signals corresponding to an output of the multiplexer 191 and provide the demultiplexed test signals to the memory dies 200 through the physical region 123.

Figure 9:
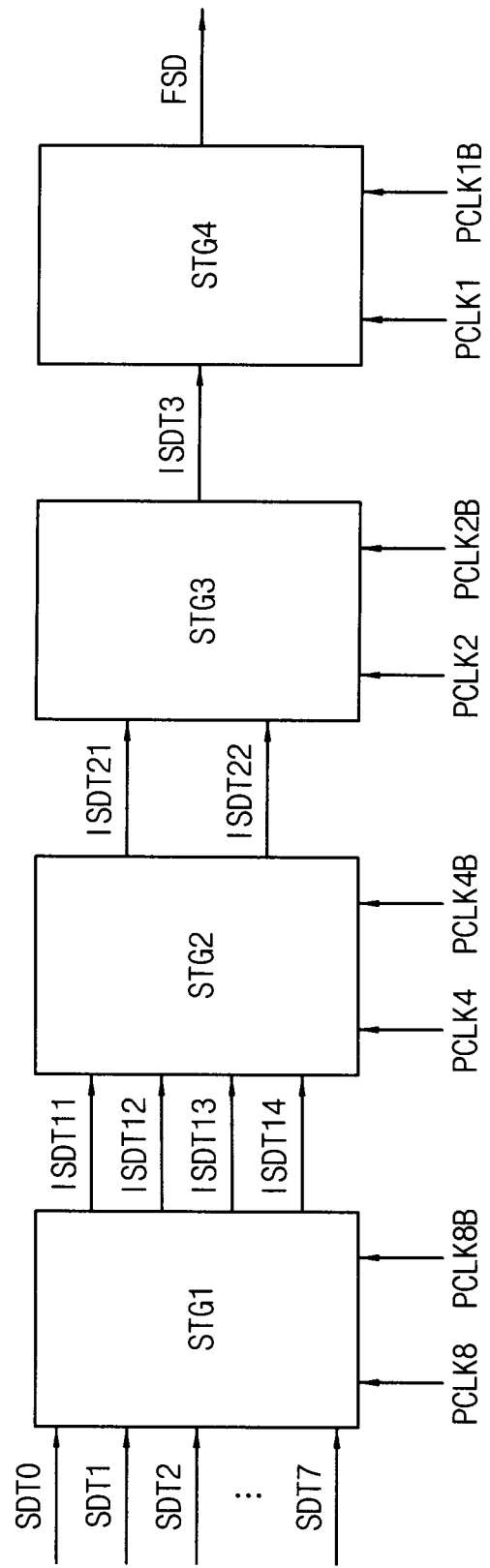
FIG. 9 is a block diagram illustrating an example of the serializer in FIG. 8 according to example embodiments.

FIG. 9 is a block diagram illustrating an example of the serializer in FIG. 8 according to example embodiments. Referring to FIG. 9, the serializer 180 may include a plurality of stages STG1, STG2, STG3 and STG4 and each of the stages STG1, STG2, STG3 and STG4 may operate based on respective one of the internal clock signals PCLK8, PCLK4, PCLK2 and PCLK1. The first stage STG1 may receive parallel data SDT0~SDT7 corresponding to the test signals TS and may merge the parallel data SDT0~SDT7 based on the first internal clock signal PCLK8 and a first inverted internal clock signal PCLK8B to generate first intermediate parallel data ISDT11, ISDT12, ISDT13 and ISDT14. In contrast, the second stage STG2 may receive the first intermediate parallel data ISDT11, ISDT12, ISDT13 and ISDT14 and may merge the first intermediate parallel data ISDT11, ISDT12, ISDT13 and ISDT14 based on the second internal clock signal PCLK4 and a second inverted internal clock signal PCLK4B to generate second intermediate parallel data ISDT21 and ISDT122.

The third stage STG3 may receive the second intermediate parallel data ISDT21 and ISDT122 and may merge the second intermediate parallel data ISDT21 and ISDT122 based on the third internal clock signal PCLK2 and a third inverted internal clock signal PCLK2B to generate an internal serial data ISDT3. Next, the fourth stage STG4 may receive the internal serial data ISDT3 and may delay the internal serial data ISDT3 based on the fourth internal clock signal PCLK1 and a fourth inverted internal clock signal PCLK1B to output a final serial data FSD.

Therefore, the serializer 180 may sequentially merge eight parallel data SDT0~SDT7 which are received in synchronization with the first internal clock signal PCLK8 and may output the final serial data FSD which is synchronized with the fourth internal clock signal PCLK1 whose frequency is eight times greater than the frequency of the first internal clock signal PCLK8.

Figure 10:
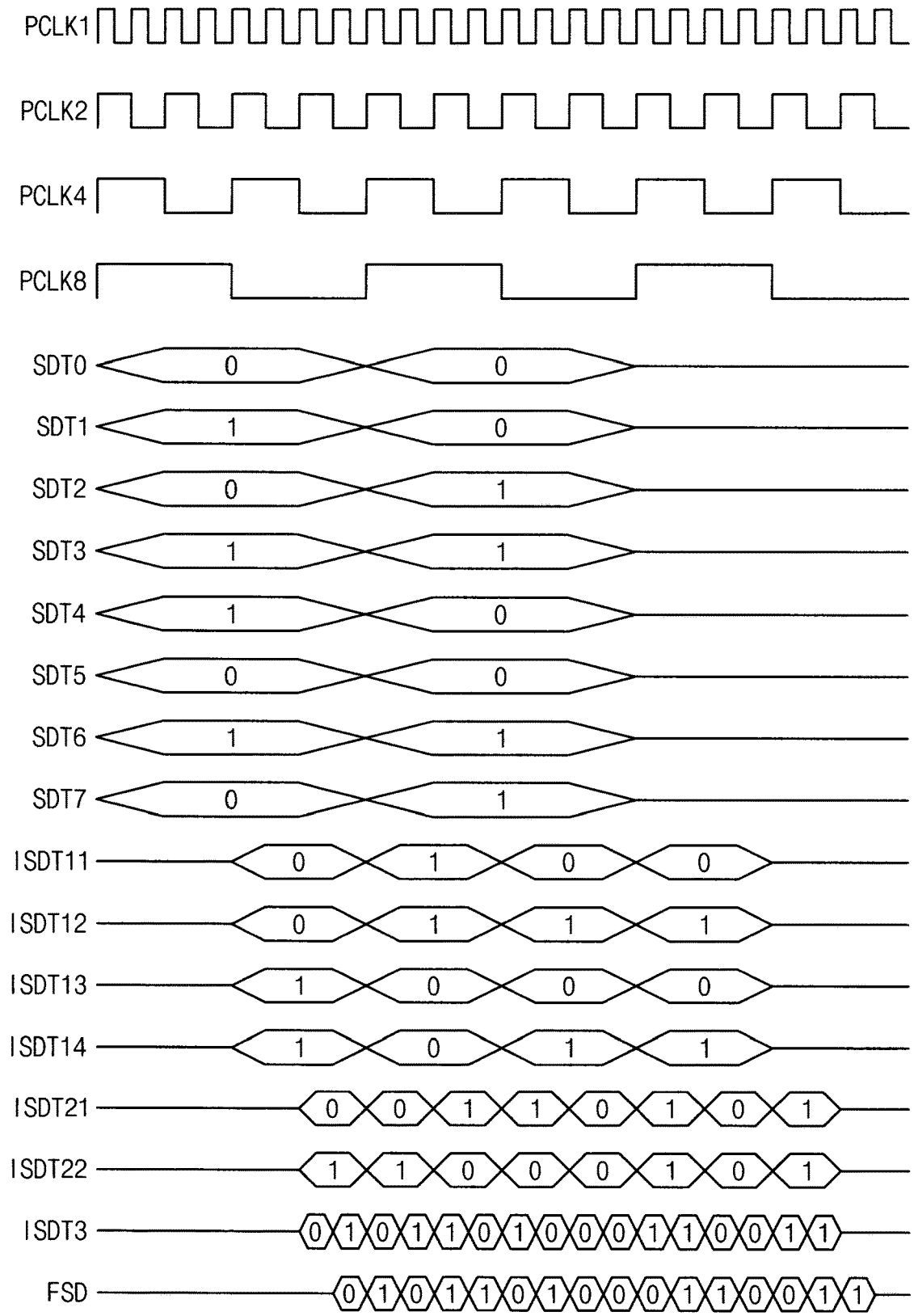
FIG. 10 is a timing diagram illustrating operation of the serializer in FIG. 9 according to example embodiments.

FIG. 10 is a timing diagram illustrating operation of the serializer in FIG. 9 according to example embodiments. Referring to FIG. 10, the serializer 180 may serialize the parallel data SDT0~SDT7 synchronized with the first internal clock signal PCLK8 into the final serial data FSD which is synchronized with the fourth internal clock signal PCLK1.

Figure 11A:
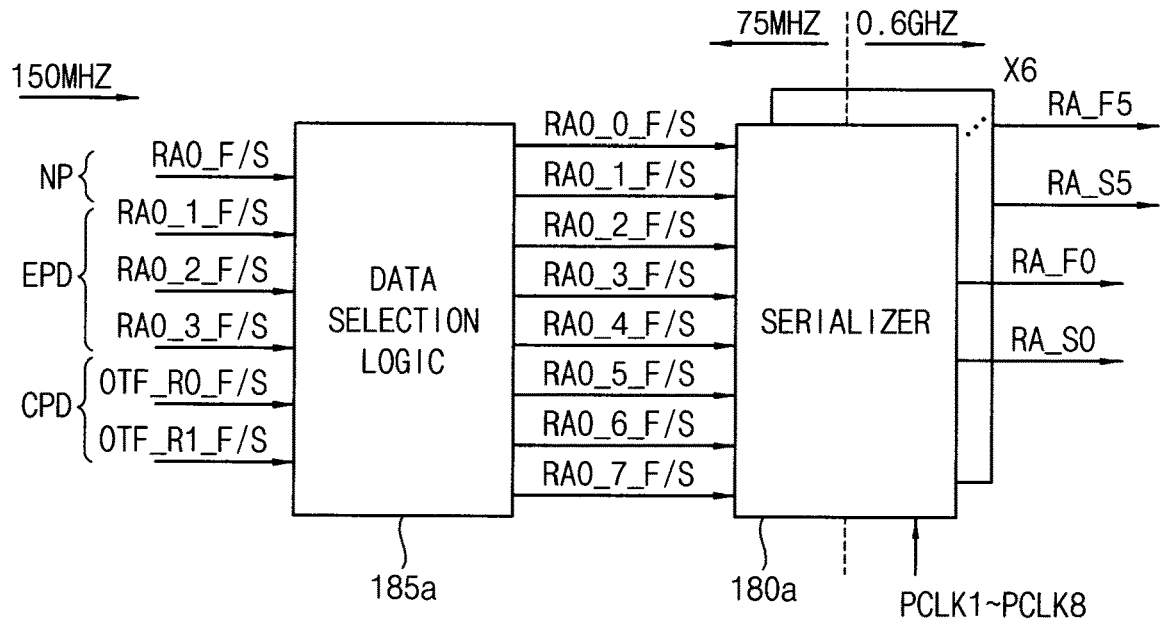
FIGS. 11A and 11B illustrate example operations of the test interface circuit of FIG. 8.
Figure 11B:
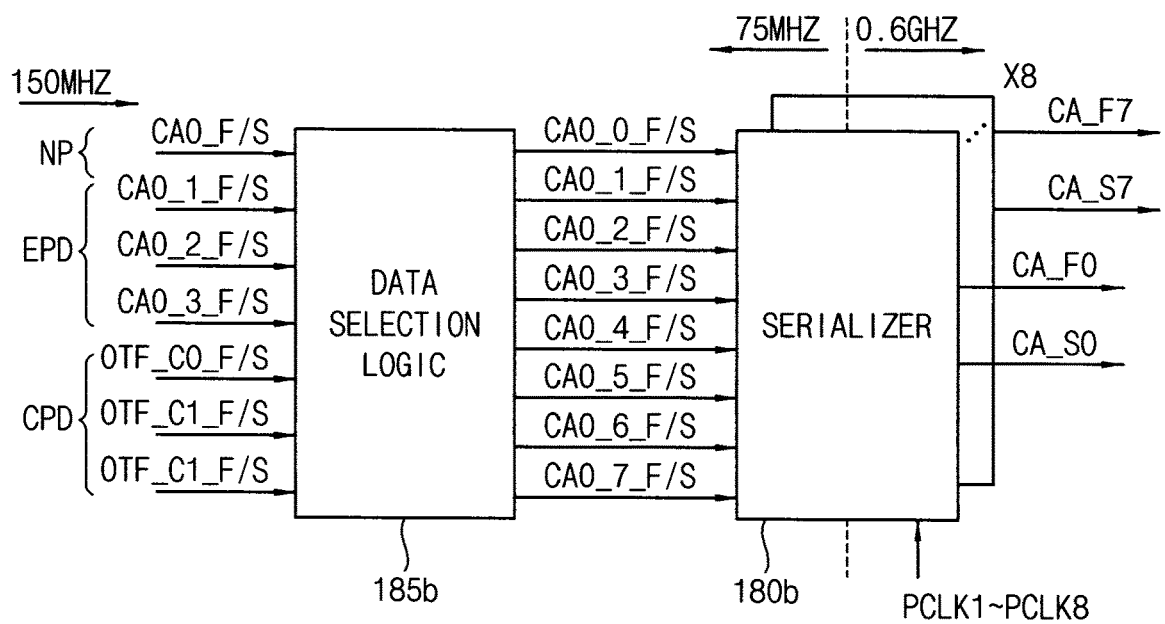

FIGS. 11A and 11B illustrate example operations of the test interface circuit of FIG. 8. FIGS. 11A and 11B respectively illustrate that the test interface circuit 130 convert addresses (test signals) synchronized with a first frequency to internal addresses (internal test signals) synchronized with a first frequency according to the control code CCD. In FIGS. 11A and 11B, a normal pad NP may be included in the first pad unit 103 and additional pads EPD and control pads CPD may be included in the second pad unit 105.

Referring to FIG. 11A, a data selection logic 185a may generate internal row addresses RA0_0_F/S~RA0_7_F/S by combining one row address RA0_F/S and input signals RA0_1_F/S, RA0_2_F/S and RA0_3_F/S received through the additional pads EPD based on a control code OTF_R0_F/S and OTF_R1_F/S received through the control pads CPD. The serializer 170a may serialize the internal row addresses RA0_0_F/S~RA0_7_F/S based on the internal clock signals PCLK8, PCLK4, PCLK2 and PCLK1 to generate 12 internal test signals (RA_F0, RA_S0) (RA_F5, RA_S5).

Referring to FIG. 11B, a data selection logic 185b may generate internal column addresses CA0_0_F/S~CA0_7_F/S by combining one column address CA0_F/S and input signals CA0_1_F/S, CA0_2_F/S and CA0_3_F/S received through the additional pads EPD based on a control code OTF_C0_F/S, OTF_C1_F/S and OTF_C2_F/S received through the control pads CPD. The serializer 170b may serialize the internal column addresses CA0_0_F/S~CA0_7_F/S based on the internal clock signals PCLK8, PCLK4, PCLK2 and PCLK1 to generate 16 internal test signals (CA_F0, CA_S0)~(CA_F7, CA_S7).

Figure 12:
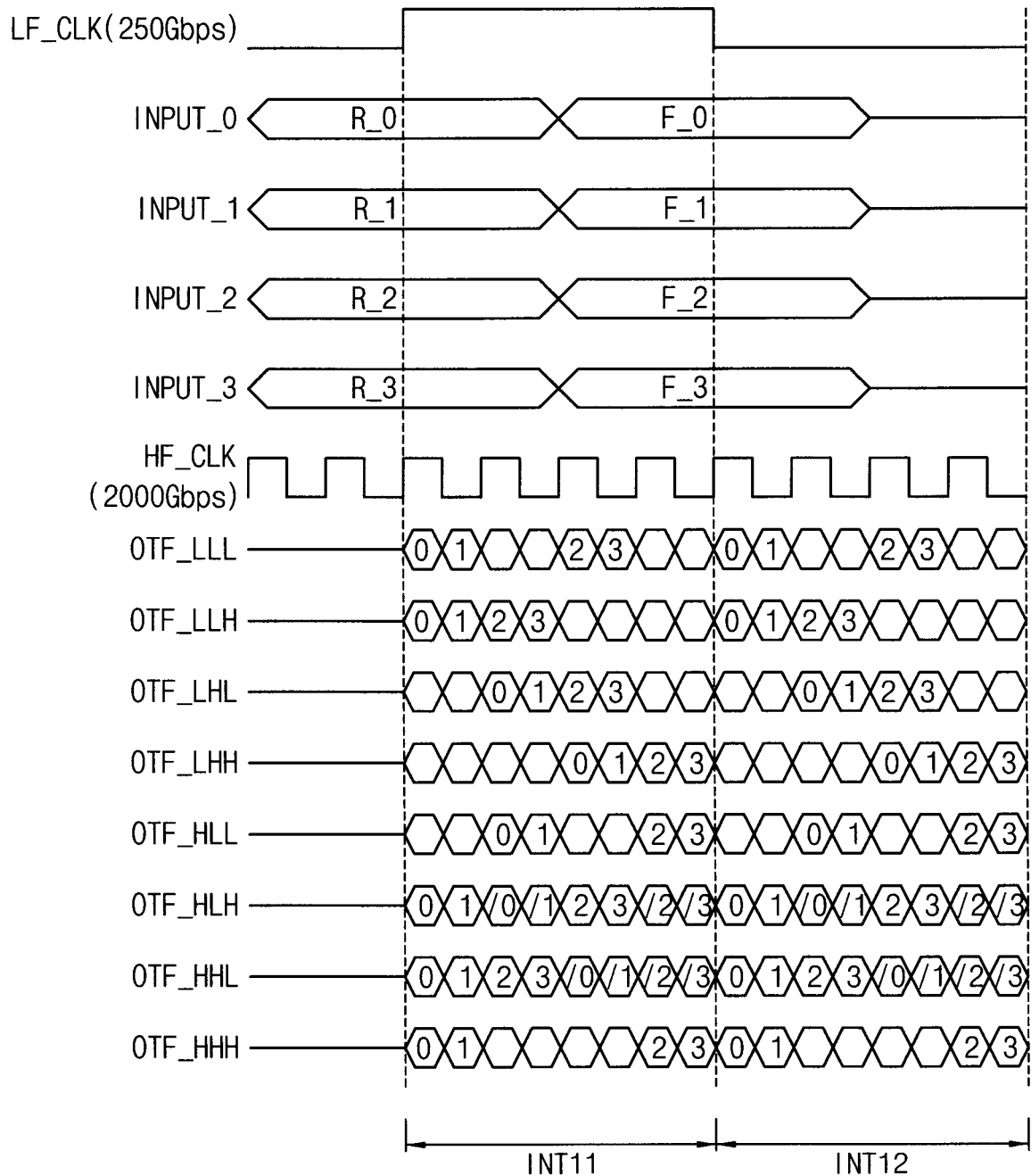
FIG. 12 illustrates an example operation of the test interface circuit of FIG. 8 according to example embodiments.

FIG. 12 illustrates an example operation of the test interface circuit of FIG. 8 according to example embodiments. FIG. 12 illustrates an example that eight combinations are generated based on four parallel data INPUT_0~INPUT_3 and 3-bit control code OTF, eight parallel data are generated based on the eight combinations, the eight parallel data serialized based on a clock signal HF_CLK and the serialized data are used as the internal test signals. The 3-bit control code OTF may include eight combinations OTF_LLL~OTF_HHH.

In FIG. 12, 0, 1, 2 and 3 in a first interval INT11 respectively represent values R_0 R_1, R_2 and R_3 obtained by respectively sampling the four parallel data INPUT_0~INPUT_3 at a rising edge of a clock signal LF_CLK, and 0, 1, 2 and 3 in a second interval INT12 respectively represent values F_0 F_1, F_2 and F_3 obtained by respectively sampling the four parallel data INPUT_0~INPUT_3 at a falling edge of the clock signal LF_CLK. In addition, /0, /1, /2 and /3 respectively represent values obtained respectively inverting the sampled values. In addition, the reference LF_CLK denotes a first clock signal having a first frequency and the reference HF_CLK denotes a second clock signal having a second frequency. The second frequency may be eight times greater than the first frequency in some embodiments of the invention.

In the semiconductor memory device 70a, a number of address pins (pads) and a number of data pins (pads) rapidly increase as operating speed of the semiconductor memory device 70a increases. For example, if the semiconductor memory device 70a is to operate four times faster, four times number of pads is also needed, which raises a burden because a size of each pads is not small.

The test interface circuit 130 according to example embodiments may P combinations of serial data based on N parallel data and M control pads. The test interface circuit 130 may generate $2^M$ patterns by adding M control pads and may generate the P serial data by combining the N parallel data and the $2^M$ patterns. Here, N is a natural number greater than one, M is a natural number greater than one and P is a natural number greater than N+M.

Figure 13:
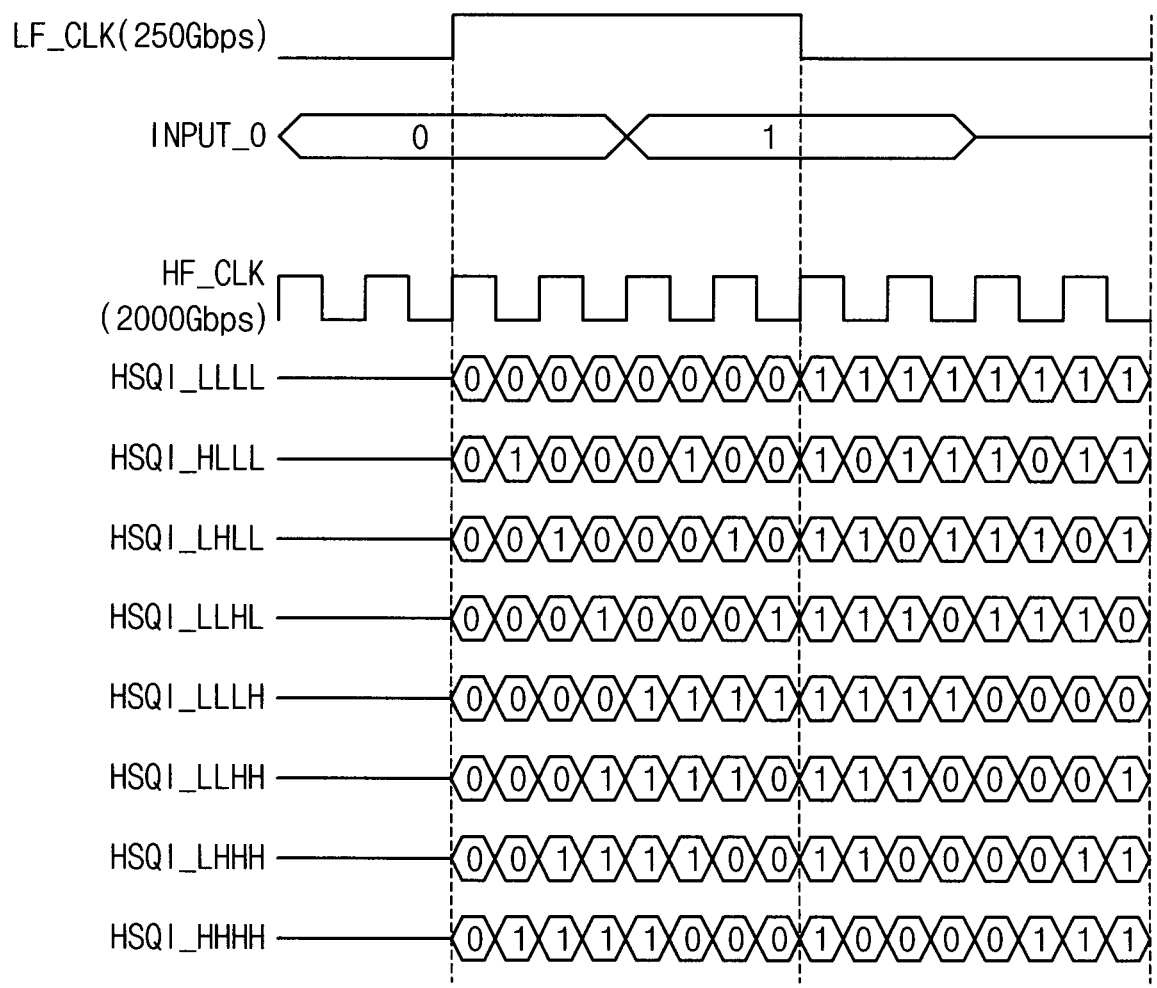
FIG. 13 illustrates an example operation of the test interface circuit of FIG. 8 according to example embodiments.

FIG. 13 illustrates an example operation of the test interface circuit of FIG. 8 according to example embodiments. As shown, eight data patterns are generated by fixing input data INPUT_0 and by copying or inverting the input data INPUT_0 based on combinations of 4-bit control code HSQI. The 4-bit control code HSQI may include eight combinations HSQI_LLLL~HSQI_HHHH. The example of FIG. 13 may be applied to a case when the test pattern TP of the test signals is converted to internal test patterns.

Figure 14A:
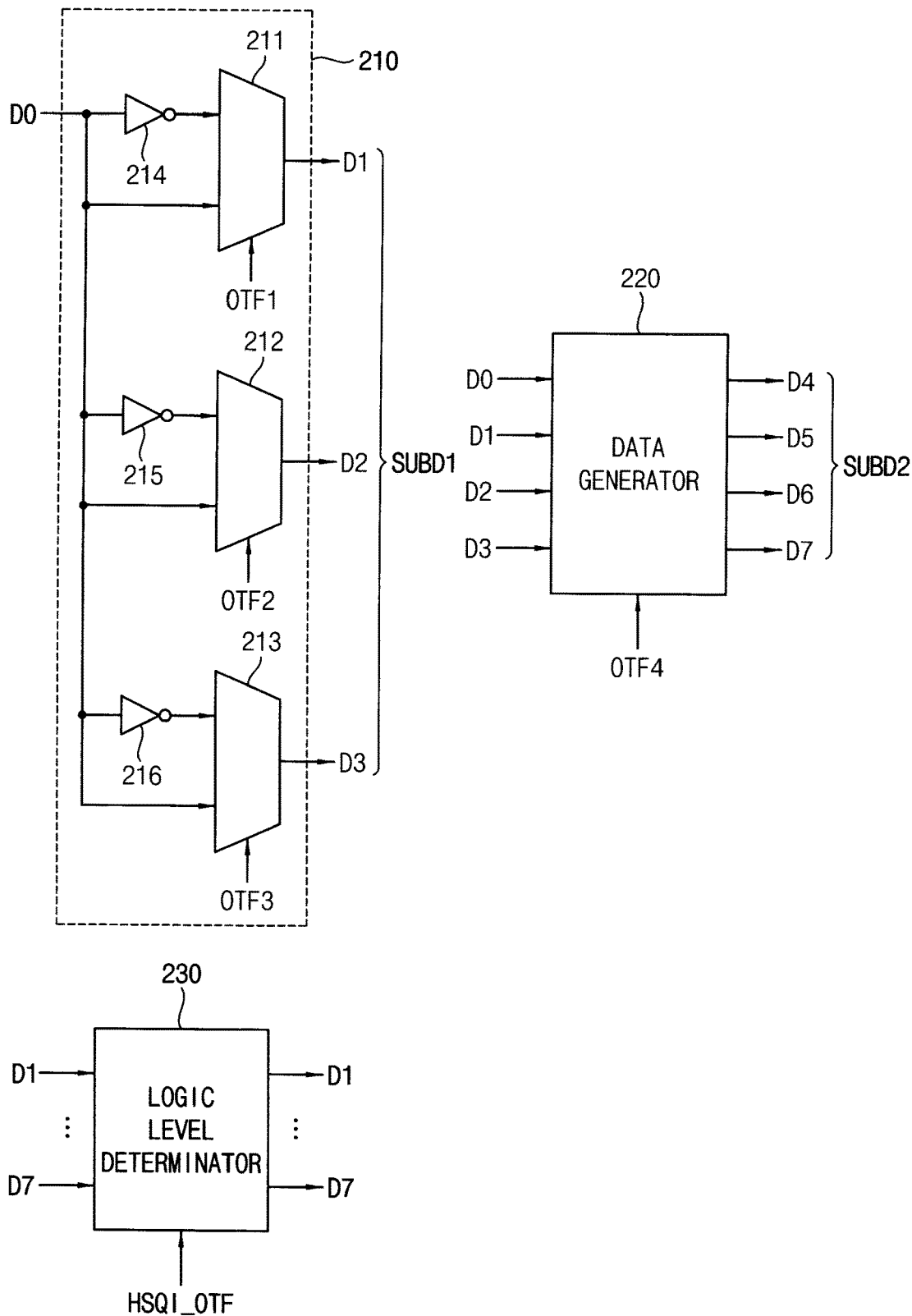
FIG. 14A illustrates an example of a data selection logic in FIG. 8
Figure 14B:
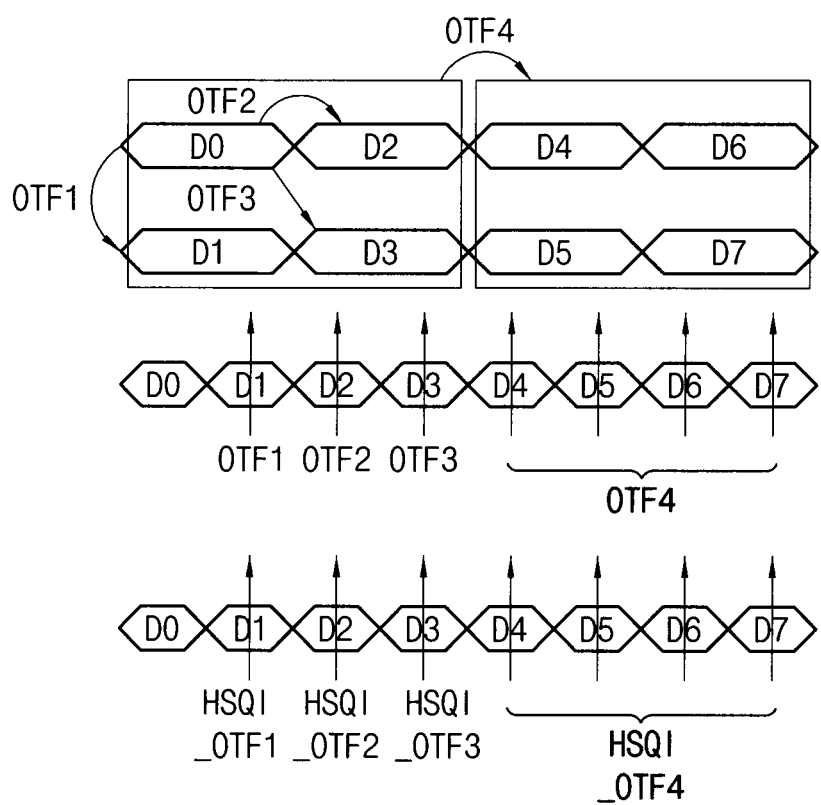
FIG. 14B illustrates that a data selection logic convert one input signal to eight combinations based on the control code.

FIG. 14A illustrates an example of a data selection logic in FIG. 8 and FIG. 14B illustrates that a data selection logic convert one input signal to eight combinations based on the control code. Referring to FIGS. 14A and 14B, the data selection logic 185 may include a first data generator 210, a second data generator 220 and a logic level determinator 230. The first data generator 210 may generate a first sub data SUBD1 including data D1, D2 and D3 by copying or inverting data D0 based on logic levels of bits OTF1, OTF2 and OTF3 of a first control code OTF. The data D0 is used as a seed. For example, the first data generator 210 may generate the first sub data SUBD1 by copying the data D0 if corresponding one of the logic levels of bits OTF1, OTF2 and OTF3 of the first control code OTF has a first logic level and by inverting the data D0 if corresponding one of the logic levels of bits OTF1, OTF2 and OTF3 of the first control code OTF has a second logic level. As illustrated, the first data generator 210 may include multiplexers 211, 212 and 213 and inverters 214, 215 and 216.

Each of the inverters 214, 215 and 216 inverts the data D0. Each of the multiplexers 211, 212 and 213 selects one of the data D0 and corresponding one of outputs of the inverters 214, 215 and 216 in response to corresponding one of the logic levels of bits OTF1, OTF2 and OTF3 of the first control code OTF to output corresponding one of the data D1, D2 and D3.

The multiplexer 211 selects one of the output of the inverter 214 and the data D0 in response to the bit OTF1 of the first control code OTF to output selected one as the data D1. Also, the multiplexer 212 selects one of the output of the inverter 215 and the data D0 in response to the bit OTF2 of the first control code OTF to output selected one as the data D2. And, the multiplexer 213 selects one of the output of the inverter 216 and the data D0 in response to the bit OTF3 of the first control code OTF to output selected one as the data D3.

The second data generator 220 receives the data D0 and the first sub data SUBD1 and may output a second sub data SUBD2 including data D4, D5, D6 and D7 by copying or inverting the data D0 and the first sub data SUBD1 based on a logic level of a bit OTF4 of the first control code OTF.

The second data generator 220 outputs the second sub data SUBD2 by inverting the data D0 and the first sub data SUBD1 if the bit OTF4 of the first control code OTF has a logic high level. The second data generator 220 outputs the second sub data SUBD2 by copying the data D0 and the first sub data SUBD1 if the bit OTF4 of the first control code OTF has a logic low level.

A configuration of the second data generator 220 may be similar with a configuration of the first data generator 210. The second data generator 220 may include a plurality of inverters and a plurality of multiplexers. The logic level determinator 230 may receive the firs sub data SUBD1 and the second sub data SUBD2 and may maintain or inverting logic levels of the firs sub data SUBD1 and the second sub data SUBD2 based on logic levels of bits HSQI_OTF1~HSQI_OTF4 of a second control code HSQI_OTF.

The logic level determinator 230 may determine each logic level of the data D1, D2 and D3 of the first sub data SUBD1 based on corresponding one of the bits HSQI_OTF1~HSQI_OTF3 of the second control code HSQI_OTF and may determine each logic level of the data D4, D5, D6 and D7 of the second sub data SUBD2 based on the bit HSQI_OTF4 of the second control code HSQI_OTF. As illustrated, the logic level determinator 230 may include a plurality of inverters and a plurality of multiplexers. In addition, the data selection logic 185 may provide the serializer 180 with the data D0, the first sub data SUBD1 and the second sub data SUBD2. Therefore, the test interface circuit 130 may generate a greater number of internal test signals than a number of additional pads which are added in the second pad unit 105.

Figure 15:
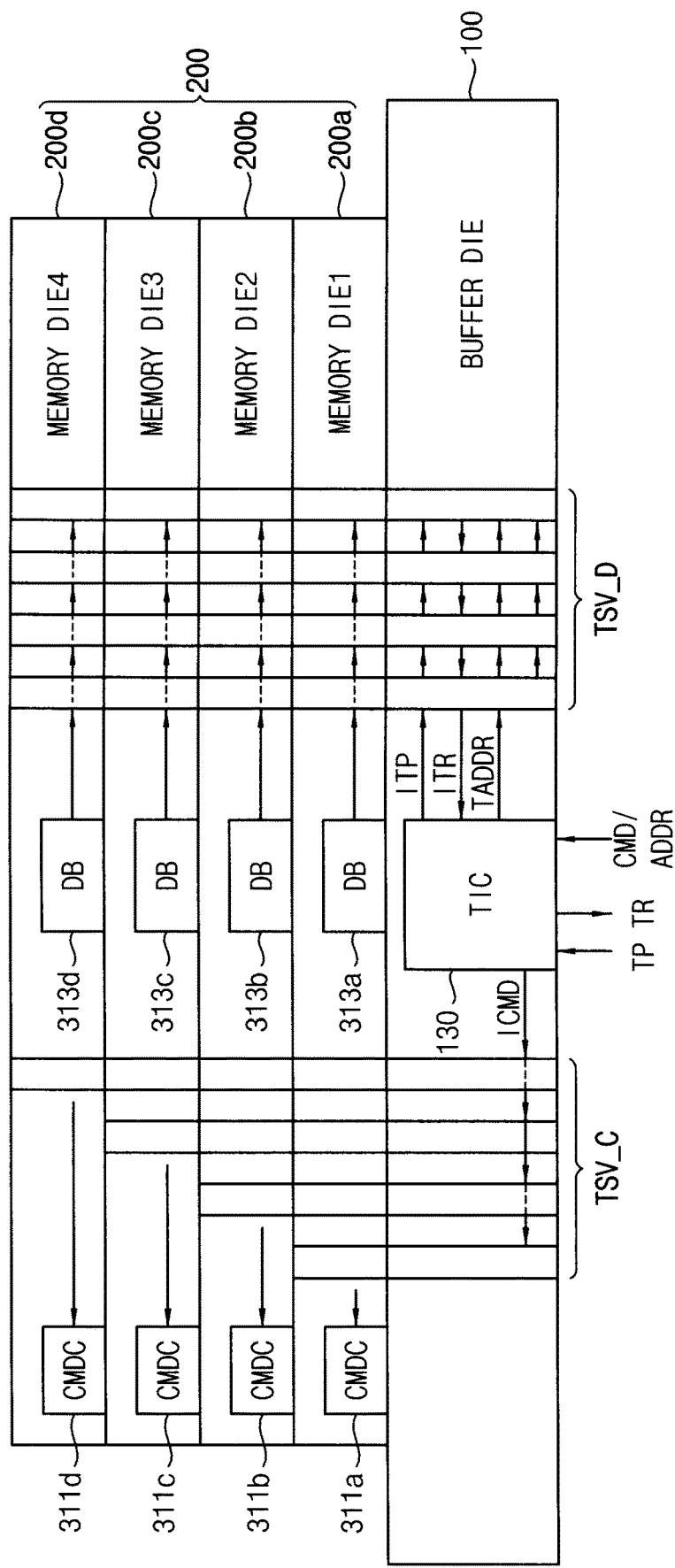
FIG. 15 illustrates that a test operation is performed in the semiconductor memory device of FIG. 5.

FIG. 15 illustrates that a test operation is performed in the semiconductor memory device of FIG. 5. Referring to FIGS. 5 and 15, the buffer die 100 includes the test interface circuit 130 disposed in the direct access region 124. The test interface circuit 130 may receive the test signals including the command CMD, the address ADDR and the test pattern TP which are synchronized with a first clock signal having a first frequency from the ATE 60 in a test mode. For example, if the test mode designates a high-frequency test, the test interface circuit 130 may convert the command CMD, the address ADDR and the test pattern TP into an internal command ICMD, an internal address TADDR and an internal test pattern ITP which are synchronized with a second clock signal having a second frequency.

The test interface circuit 130 may perform testing of the memory dies 200 by providing the internal command ICMD to the memory dies 200 through command TSVs TSV_C which are independently formed for each channel, by providing the internal test pattern ITP and the internal address TADDR to one of the memory dies 200 through data TSV TSV_D extending through the memory dies 200, by receiving internal test result signal ITR from one of the memory dies 200 and by providing the ATE 60 with the internal test result signal ITR as the test result data TR. And, if the test mode designates a low-frequency test, the test interface circuit 130 performs test on the memory dies 200 by providing the internal test signals synchronized with the first clock signal without changing a frequency of the test signals.

The memory dies 200 may respectively include command decoders 311a to 311d which output internal control signals by decoding the internal command ICMD and data input/output (I/O) buffers 313a to 313d which provide the internal test pattern ITP to corresponding memory cell arrays.

Figure 16:
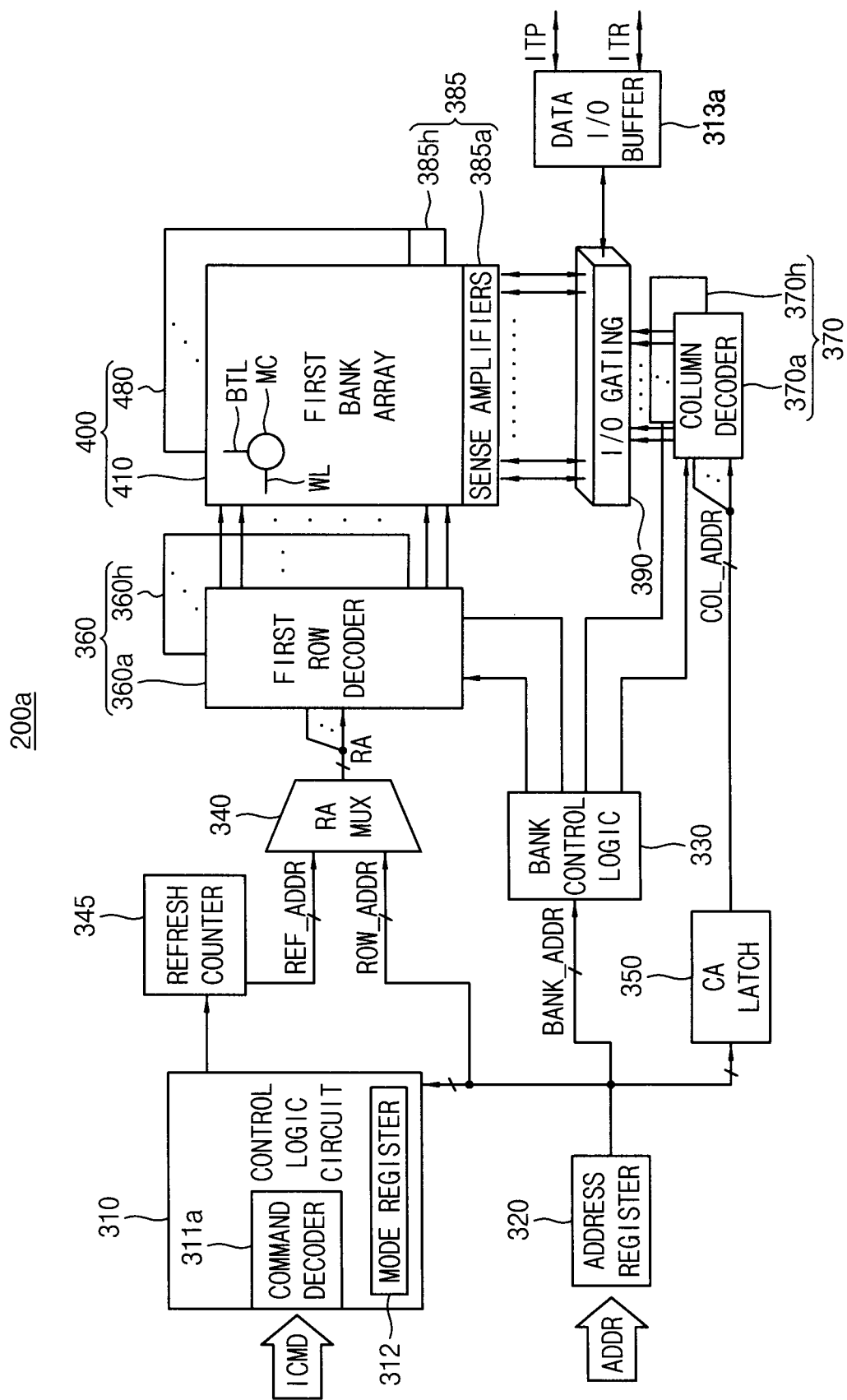
FIG. 16 is a block diagram illustrating one of the memory dies in the semiconductor memory device of FIG. 2 according to example embodiments.

FIG. 16 is a block diagram illustrating one of the memory dies in the semiconductor memory device of FIG. 2 according to example embodiments. In FIG. 16, a configuration of the memory die 200a is illustrated and each configuration of the memory dies 200b~200k may be substantially the same as the configuration of the memory die 200a. Referring to FIG. 16, the memory die 200a includes the control logic circuit 310, an address register 320, a bank control logic 330, a refresh counter 345, a row address multiplexer 340, a column address latch 350, a row decoder 360, a column decoder 370, the memory cell array 400, a sense amplifier unit 385, an I/O gating circuit 390, and a data I/O buffer 313a.

The memory cell array 400 includes first through eighth bank arrays 410~480. The row decoder 360 includes first through eighth bank row decoders 360a~360h respectively coupled to the first through eighth bank arrays 410~480, the column decoder 370 includes first through eighth bank column decoders 370a~370h respectively coupled to the first through eighth bank arrays 410~480, and the sense amplifier unit 385 includes first through eighth bank sense amplifiers 385a~385h respectively coupled to the first through eighth bank arrays 410~480.

The first through eighth bank arrays 410~480, the first through eighth bank row decoders 360a~360h, the first through eighth bank column decoders 370a~370h and first through eighth bank sense amplifiers 385a~385h may form first through eighth banks. Each of the first through eighth bank arrays 410~480 includes a plurality of memory cells MC formed at intersections of a plurality of word-lines WL and a plurality of bit-line BTL.

The address register 320 receives the address ADDR including a bank address BANK_ADDR, a row address ROW_ADDR and a column address COL_ADDR from an outside. The address register 320 provides the received bank address BANK_ADDR to the bank control logic 330, provides the received row address ROW_ADDR to the row address multiplexer 340, and provides the received column address COL_ADDR to the column address latch 350. The bank control logic 330 generates bank control signals in response to the bank address BANK_ADDR. One of the first through eighth bank row decoders 360a~360h corresponding to the bank address BANK_ADDR is activated in response to the bank control signals, and one of the first through eighth bank column decoders 370a~370h corresponding to the bank address BANK_ADDR is activated in response to the bank control signals.

The row address multiplexer 340 receives the row address ROW_ADDR from the address register 320, and receives a refresh row address REF_ADDR from the refresh counter 345. The row address multiplexer 340 selectively outputs the row address ROW_ADDR or the refresh row address REF_ADDR as a row address RA. The row address RA that is output from the row address multiplexer 340 is applied to the first through eighth bank row decoders 360a~360h. The refresh counter 345 may sequentially output the refresh row address REF_ADDR under control of the control logic circuit 310. The activated one of the first through eighth bank row decoders 360a~360h, by the bank control logic 330, decodes the row address RA that is output from the row address multiplexer 340, and activates a word-line corresponding to the row address RA. For example, the activated bank row decoder applies a word-line driving voltage to the word-line corresponding to the row address.

The column address latch 350 receives the column address COL_ADDR from the address register 320, and temporarily stores the received column address COL_ADDR. In some embodiments, in a burst mode, the column address latch 350 generates column addresses that increment from the received column address COL_ADDR. The column address latch 350 applies the temporarily stored or generated column address to the first through eighth bank column decoders 370a~370h.

The activated one of the first through eighth bank column decoders 370a~370h activates a sense amplifier corresponding to the bank address BANK_ADDR and the column address COL_ADDR through the I/O gating circuit 390. The I/O gating circuit 390 includes a circuitry for gating input/output data, and further includes input data mask logic, read data latches for storing data that is output from the first through eighth bank arrays 410~480, and write drivers for writing data to the first through eighth bank arrays 410~480.

Data (the internal test result signal ITR) read from one bank array of the first through eighth bank arrays 410~480 is sensed by a sense amplifier coupled to the one bank array from which the data is to be read, and is stored in the read data latches. The data stored in the read data latches may be provided to the outside through the data I/O buffer 313a. The data (the internal test pattern ITP) to be written in one bank array of the first through eighth bank arrays 410~480 may be provided to the I/O gating circuit 390 and the I/O gating circuit 390 may write the data in one bank array through the write drivers. The data I/O buffer 313a may store the internal test pattern ITP s in the memory cell array 400 through the I/O gating circuit 390 in a write operation of the test mode and may provide the internal test result signal ITR in responding to the internal test pattern ITP to the test interface circuit 130 in a read operation of the test mode.

The control logic circuit 310 may control operations of the memory die 300a. For example, the control logic circuit 310 may generate control signals for the memory die 300a in order to perform a write operation or a read operation. As illustrated, the control logic circuit 310 includes the command decoder 311a that decodes the internal command ICMD received from the test interface circuit 130 and a mode register 312 that sets an operation mode of the memory die 300a.

Figure 17:
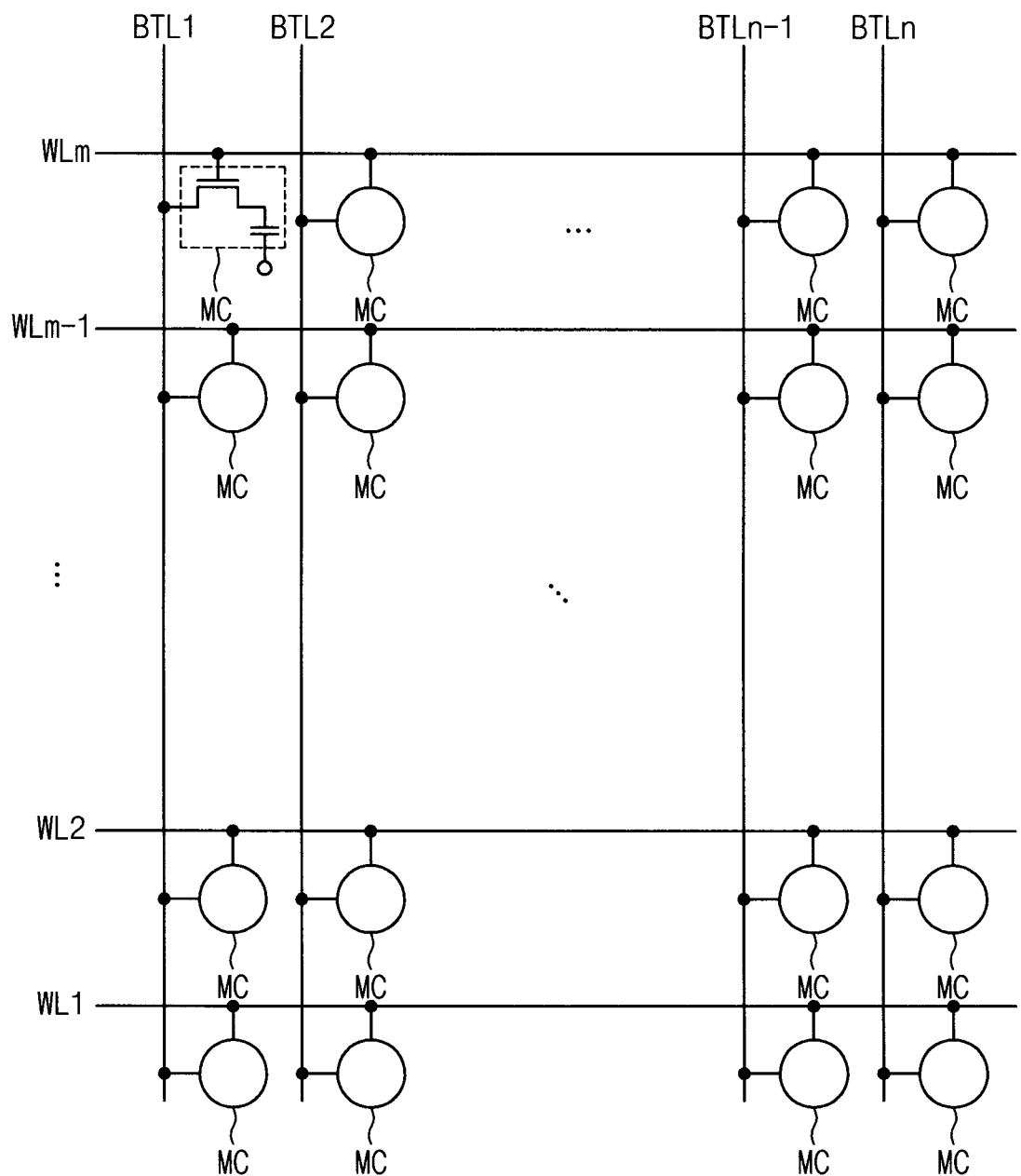
FIG. 17 illustrates an example of the first bank array in the memory die of FIG. 16.

FIG. 17 illustrates an example of the first bank array in the memory die of FIG. 16. Referring to FIG. 17, the first bank array 410 includes a plurality of word-lines WL1~WLm (m is a natural number greater than two), a plurality of bit-lines BTL1~BTLn (n is a natural number greater than two), and a plurality of dynamic memory cells MCs disposed at intersections between the word-lines WL1~WLm and the bit-lines BTL1~BTLn. Each of the dynamic memory cells MCs includes a cell transistor coupled to each of the word-lines WL1~WLm and each of the bit-lines BTL1~BTLn and a cell capacitor coupled to the cell transistor.

Figure 18:
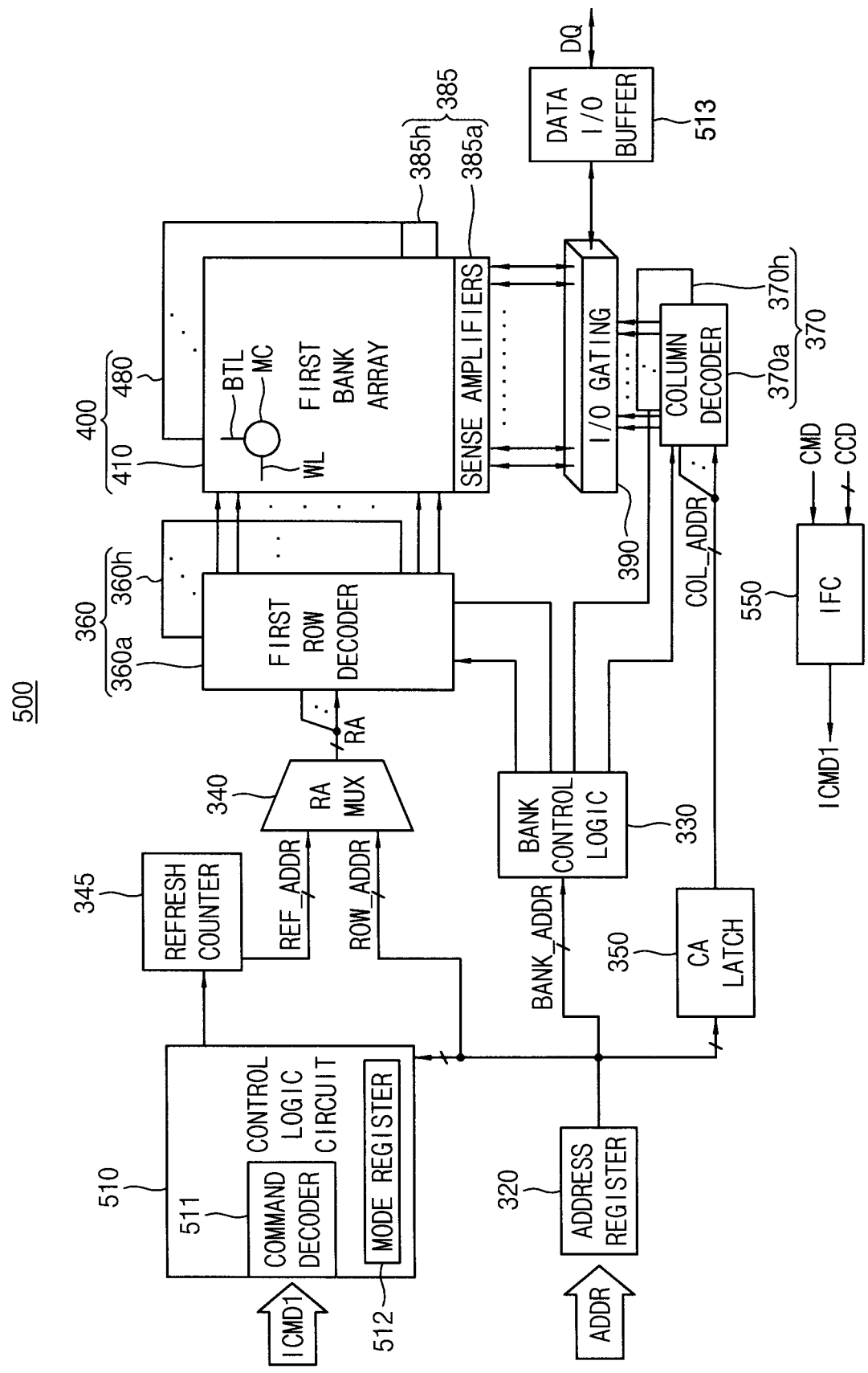
FIG. 18 is a block diagram the semiconductor memory device according to example embodiments.

FIG. 18 is a block diagram the semiconductor memory device according to example embodiments. As shown, a semiconductor memory device 500 of FIG. 18 differs from the memory die 200a in that the semiconductor memory device 500 includes a control logic circuit 510 instead of the control logic circuit 310 and a data I/O buffer 513 instead of the data I/O buffer 213a and further includes an interface circuit 550.

Hereinafter, there will be description on the interface circuit 550, the control logic circuit 510 and the data I/O buffer 513. The interface circuit 500 receives the command CMD and the control code CCD, generates an internal command ICMD1 by combining the command CMD and the control code CCD and provides the internal command ICMD1 to the control logic circuit 510. A second number of command sets designated by the internal command ICMD1 may be greater than a first number of command sets designated by the command CMD. Therefore, the semiconductor memory device 500 may receive the command CMD supporting partial command sets to generate the internal command ICMD1 supporting full command set.

The control logic circuit 510 may control operations of the semiconductor memory device 500. For example, the control logic circuit 510 may generate control signals for the semiconductor memory device 500 in order to perform a write operation or a read operation. The control logic circuit 510 includes the command decoder 511 that decodes the internal command ICMD1 received from the interface circuit 550 and a mode register 512 that sets an operation mode of the semiconductor memory device 500. The data I/O buffer 513 store the data DQ in the memory cell array 400 through the I/O gating circuit 390 in a write operation, receives the data DQ read from the memory cell array 400 from the I/O gating circuit 390 and provides the data DQ to an external device in a read operation.

Figure 19:
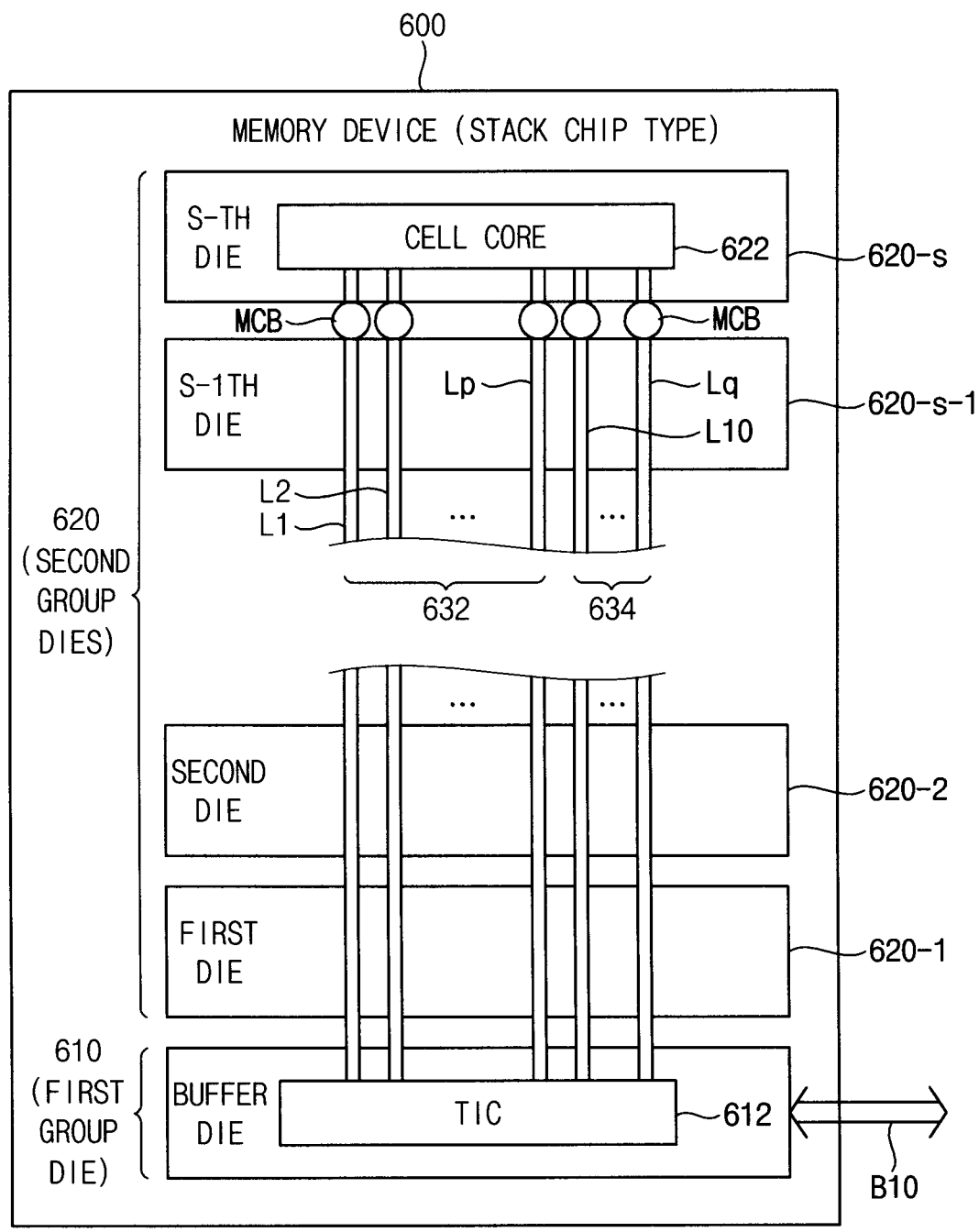
FIG. 19 is a block diagram illustrating a semiconductor memory device according to example embodiments.

FIG. 19 is a block diagram illustrating a semiconductor memory device according to example embodiments. According to FIG. 19, a semiconductor memory device 600 may include a first group of dies 610 and a second group of dies 620 providing a stacked chip structure. The first group of dies 610 may include at least one buffer die 611. The second group of dies 620 may include a plurality of memory dies 620-1 to 620-s which is stacked on the buffer die 611 and conveys data through a plurality of through substrate via (or, through silicon via (TSV)) lines. Here, "s" is an integer greater than two.

Each of the memory dies 620-1 to 620-s may include a cell core 622 to store data. The buffer die 611 may include a test interface circuit 612 and the test interface circuit 612 may perform test on the memory dies 620-1 to 620-s by converting test signals synchronized with a first clock signal toggling with a first frequency into internal test signals synchronized with a second clock signal toggling with a second frequency based on a control code and by providing the internal test signals to at least some of the memory dies 620-1 to 620-s.

The semiconductor memory device 600 may be a stack chip type memory device or a stacked memory device which conveys data and control signals through the TSV lines. The TSV lines may be also called 'through electrodes'. With the above description, a data TSV line group 632 which is formed at one memory die 620-p may include a plurality of TSV lines L1 to Lp, and a parity TSV line group 634 may include a plurality of TSV lines L10 to Lq. The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor. The semiconductor memory device 600 may have a three-dimensional (3D) chip structure or a 2.5D chip structure to communicate with the host through a data bus B10. The buffer die 610 may be connected with the memory controller through the data bus B10.

Figure 20:
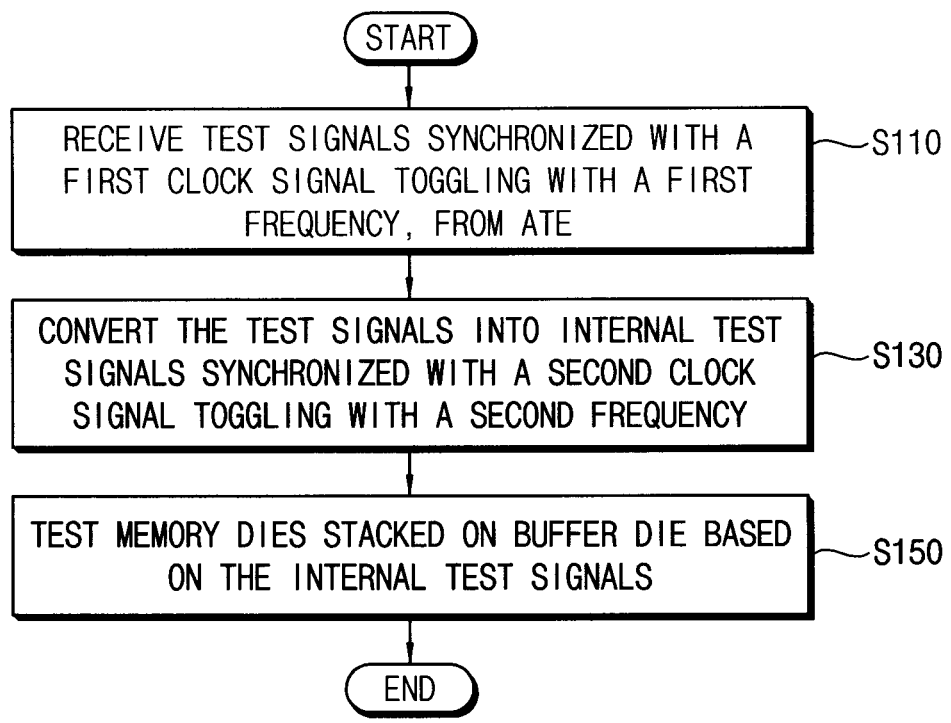
FIG. 20 is a flow chart illustrating a method of testing a semiconductor memory device according to example embodiments.

FIG. 20 is a flow chart illustrating a method of testing a semiconductor memory device according to example embodiments. Referring to FIGS. 2, 4 through 17 and 20, there is provided a method of testing a semiconductor memory device 70 that includes a buffer die 100 and memory dies 200a~200k stacked on the buffer die 100. In the method, the buffer die 100 receive test signals synchronized with a first clock signal toggling with a first frequency from the ATE 60 in operation S110.

The test interface circuit 130 included in the buffer die 100 can convert the test signals into internal test signals synchronized with a second clock signal toggling with a second frequency in operation S130. The second frequency may be P times greater than the first frequency and P is an integer greater than three. The test interface circuit 130 may be disposed in a direct access region 124 in the buffer die 100.

The test interface circuit 130 may perform testing on the memory dies 200a~200k by providing the internal test signals to at least one of the memory dies 200a~200k in operation S150. Therefore, the semiconductor memory device and a method of testing the semiconductor memory device may perform P times higher-frequency test on the buffer die and the memory dies with low-costed ATE by adding pads smaller than P, converting the test signals with a first frequency to internal test signals with a second frequency based on control codes inputted to the added pads and a serializer and providing the internal test signals to the memory dies. In addition, the semiconductor memory device may support full command sets with partial command sets by using the added pads.

Figure 21:
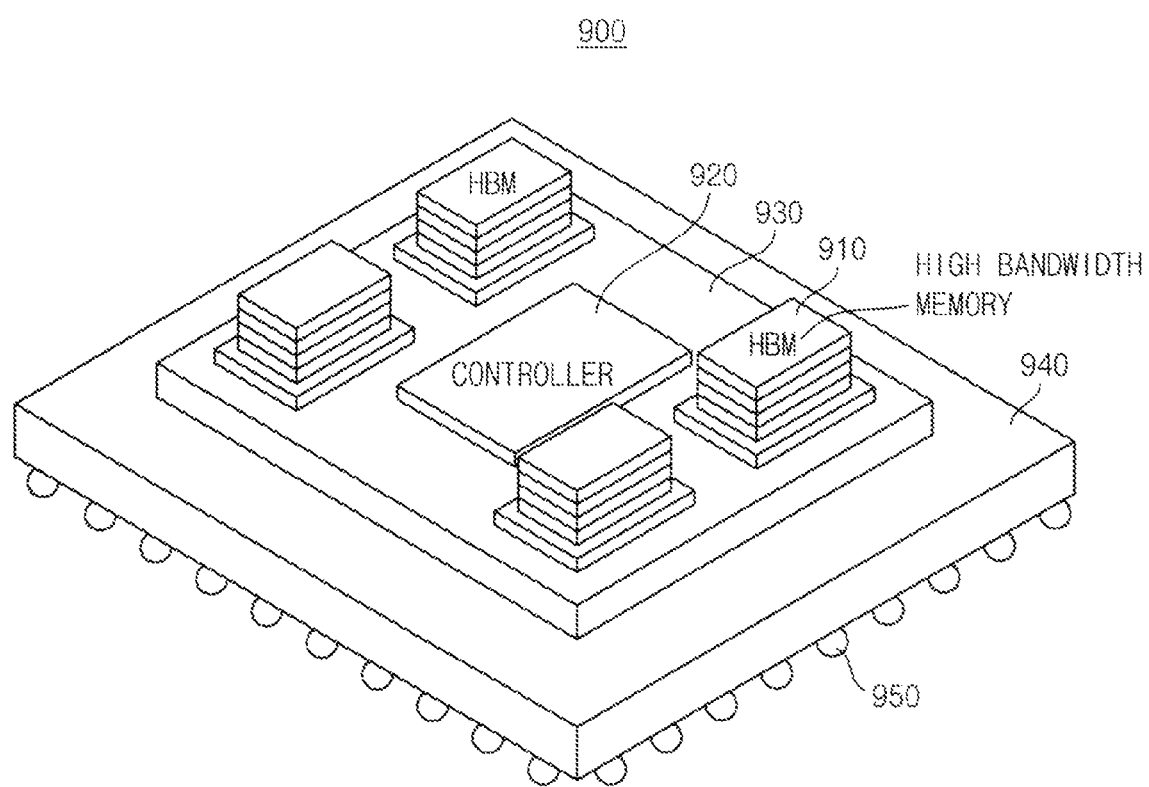
FIG. 21 is a configuration diagram illustrating a semiconductor package including the stacked memory device according to example embodiments.

FIG. 21 is a configuration diagram illustrating a semiconductor package including a stacked memory device according to example embodiments. Referring to FIG. 21, a semiconductor package 900 may include one or more stacked memory devices 910 and a memory controller 920. The stacked memory devices 910 and memory controller 920 may be mounted on an interposer 930, and the interposer on which the stacked memory device 910 and memory controller 920 are mounted may be mounted on a package substrate 940. The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a memory device in a high bandwidth memory (HBM) form in which a plurality of layers are stacked. Therefore, the stacked memory device 910 may include a buffer die and a plurality of memory dies. Advantageously, the stacked memory device 910 may have a configuration that enables a high-frequency test with a low-costed ATE in a chip-on wafer state. The plurality of stacked memory devices 910 may be mounted on the interposer 930, and memory controller 920 may communicate with the plurality of stacked memory devices 910.

For example, each of the stacked memory devices 910 and memory controller 920 may include a physical region, and communication may be performed between the stacked memory devices 910 and memory controller 920 through the physical regions. Meanwhile, when the stacked memory device 910 includes a direct access region, a test signal may be provided into the stacked memory device 910 through conductive means (e.g., solder balls 950) mounted under package substrate 940 and the direct access region. Aspects of the present inventive concept may be applied to test of semiconductor memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. An integrated circuit device, comprising:
   a stack of memory dies having a plurality of through-substrate vias (TSVs) extending therethrough; and
   a buffer die electrically coupled to the plurality of TSVs, said buffer die comprising a test interface circuit configured to: (i) generate a plurality of internal test signals, which are synchronized with a second clock signal having a second frequency, from at least one control code, and from a plurality of external test signals, which are synchronized with a first clock signal having a first frequency less than the second frequency, and (ii) provide the plurality of internal test signals to at least one of the memory dies in said stack during a first test mode.

2. The device of claim 1, wherein the second frequency is greater than three (3) times the first frequency, and
   wherein the test interface circuit comprises a phase-locked loop (PLL) circuit configured to generate the second clock signal in response to a reference clock signal.

3. The device of claim 2, wherein the PLL is configured to generate a plurality of internal clock signals including the second clock signal; and wherein the test interface circuit comprises a serializer configured to use the plurality of internal clock signals when generating the internal test signals by sequentially merging parallel data corresponding to the external test signals.

4. The device of claim 3, wherein the serializer comprises:
   a first serializer stage configured to generate first intermediate parallel data by merging the parallel data in-sync with a first of the plurality of internal clock signals; and
   a second serializer stage configured to generate second intermediate parallel data by merging the first intermediate parallel data in-sync with a second of the plurality of internal clock signals having a different frequency relative to the first of the plurality of internal clock signals.

5. The device of claim 4, wherein the serializer further comprises:
   a third serializer stage configured to generate internal serial data by merging the second intermediate parallel data in-sync with a third of the plurality of internal clock signals having a different frequency relative to the second of the plurality of internal clock signals; and
   a fourth serializer stage configured to generate final serial data by delaying the internal serial data.

6. The device of claim 5, wherein a frequency of the second of the plurality of internal clock signals is two times greater than a frequency of the first of the plurality of internal clock signals; and wherein a frequency of the third of the plurality of internal clock signals is two times greater than the frequency of the second of the plurality of internal clock signals.

7. The device of claim 3, wherein the test interface circuit further comprises data selection logic configured to generate the parallel data by combining the plurality of external test signals and an input signal, based on the at least one control code, and wherein the external test signals and the input signal include row addresses.

8. A semiconductor memory device comprising:
a buffer die configured to communicate with an external device;
a plurality of memory dies stacked on the buffer die; and
a plurality of through silicon vias (TSVs) extending through the plurality of memory dies to connect to the buffer die,
wherein the buffer die includes a test interface circuit,
wherein the test interface circuit is configured to perform a test on the memory dies by converting test signals received through a first pad unit from the external device into internal test signals based on at least one control code received through a second pad unit and by providing the internal test signals to at least one of the memory dies in a first test mode,
wherein the test signals are synchronized with a first clock signal toggling with a first frequency and the internal test signals are synchronized with a second clock signal toggling with a second frequency, and
wherein the second frequency is greater than the first frequency.

9. The semiconductor memory device of claim 8, wherein the second frequency is P times greater than the first frequency and P is a natural number greater than three.

10. The semiconductor memory device of claim 8, wherein the buffer die includes a direct access region, a TSV region and a physical region,
wherein the test interface circuit is disposed in the direct access region,
wherein the second pad unit is connected to the direct access region, and
wherein the test interface circuit includes:
a phase-locked loop (PLL) circuit configured to generate internal clock signals including the second clock signal based on a reference clock signal; and
a serialzier configured to serialize parallel data corresponding to the test signals by using the internal clock signals to provide the internal test signals.

11. The semiconductor memory device of claim 10, wherein the serializer is configured to sequentially merge the parallel data based on the internal clock signal to output a final serial data.

12. The semiconductor memory device of claim 10, wherein the serializer includes:
a first stage configured to merge the parallel data to generate first intermediate parallel data based on a first internal clock signal of the internal clock signals;
a second stage configured to merge the first intermediate parallel data to generate second intermediate parallel data based on a second internal clock signal of the internal clock signals;
a third stage configured to merge the second intermediate parallel data to generate an internal serial data based on a third internal clock signal of the internal clock signals; and
a fourth stage configured to delay the third intermediate parallel data to output the final serial data as the internal test signal based on a fourth internal clock signal of the internal clock signals, and wherein:

a frequency of the first internal clock signal is the same as the first frequency of the first clock signal;
a frequency of the second internal clock signal is two times greater than the first frequency of the first clock signal;
a frequency of the third internal clock signal is four times greater than the first frequency of the first clock signal; and
a frequency of the fourth internal clock signal is eight times greater than the first frequency of the first clock signal.

13. The semiconductor memory device of claim 10, wherein the test interface circuit further includes:
a data selection logic configured to generate the parallel data by combining the test signals and an input signal received through the second pad unit based on the at least one control code; and
a multiplexer configured to select one of the test signals and the internal test signals in response to a test mode enable signal to provide selected test signals to a physical region in the buffer die.

14. The semiconductor memory device of claim 13, wherein the data selection logic is configured to generate P-bit of the parallel data by combining the test signals, N-bit of the input signal and N-bit of the at least one control code, and
wherein, N is a natural number greater than one, M is a natural number greater than one and P is a natural number greater than N+M.

15. The semiconductor memory device of claim 13, wherein:
the test signals and the input signals include row addresses;
the data selection logic is configured to output internal row addresses as the parallel data by combing the row address and bits of the at least one control code; and
a number of the internal row addresses is greater than a number of the row addresses.

16. The semiconductor memory device of claim 13, wherein:
the test signals and the input signals include column addresses;
the data selection logic is configured to output internal column addresses as the parallel data by combing the column address and bits of the at least one control code; and
a number of the internal column addresses is greater than a number of the column addresses.

17. The semiconductor memory device of claim 13, wherein:
the test signals include a test pattern;
the data selection logic is configured to generate a plurality of data patterns by either copying the test pattern or inverting the test pattern based on bits of the at least one control code; and
the serializer is configured to output an internal test pattern by sampling the data patterns at an edge of the second clock signal.

18. The semiconductor memory device of claim 13, wherein:
the test signals include a test pattern;
the at least one control code includes a first control code and a second control code;
the data selection logic is configured to generate a first sub data by copying the test pattern and inverting the test pattern based on the first control code and is configured to generate a second sub data by copying or inverting the test pattern and the first sub data based on the first control code; and the data selection logic is configured to determine logic levels of the first sub data and the second sub data based on the second control code.

19. The semiconductor memory device of claim 8, wherein each of the memory dies includes a memory cell array and the memory cell array includes a plurality of dynamic memory cells coupled to a plurality of word-lines and a plurality of bit-lines.

20. A method of testing a semiconductor memory device which includes a buffer dies and a plurality of memory dies stacked on the buffer die, the method comprising:

receiving, by the buffer die, test signals from an external automated test device (ATE);

converting, by a test interface circuit in the buffer die, the test signals into internal test signals based on a received control code; and providing, by the test interface circuit, the internal test signals to at least one of the memory dies through a plurality of through silicon vias extending through the plurality of memory dies to connect to the buffer die, wherein the test signals are synchronized with a first clock signal toggling with a first frequency and the internal test signals are synchronized with a second clock signal toggling with a second frequency, wherein the buffer die is connected to the ATE through a first pad unit and a second pad unit, and wherein the test interface circuit is disposed in a direct access region of the buffer die.

* * * * *